(12) United States Patent
Jeloka et al.

(10) Patent No.: US 11,011,227 B2
(45) Date of Patent: May 18, 2021

(54) METHOD, SYSTEM AND DEVICE FOR NON-VOLATILE MEMORY DEVICE OPERATION

(71) Applicant: ARM Ltd., Cambridge (GB)

(72) Inventors: Supreet Jeloka, Austin, TX (US); Shidhartha Das, Upper Cambourne (GB); Mudit Bhargava, Austin, TX (US); Saurabh Pijuskumar Sinha, San Antonio, TX (US); James Edwards Myers, Bottisham (GB)

(73) Assignee: ARM Ltd., Cambridge (GB)

( * ) Notice: Subject to any disclaimer, the term of this patent is extended or adjusted under 35 U.S.C. 154(b) by 0 days.

(21) Appl. No.: 16/010,253

(22) Filed: Jun. 15, 2018

(65) Prior Publication Data

US 2019/0385675 A1   Dec. 19, 2019

(51) Int. Cl.
*G11C 13/00* (2006.01)

(52) U.S. Cl.
CPC ........ *G11C 13/004* (2013.01); *G11C 13/0069* (2013.01); *G11C 2013/0045* (2013.01); *G11C 2013/0078* (2013.01); *G11C 2213/31* (2013.01); *G11C 2213/32* (2013.01)

(58) Field of Classification Search
CPC .............. G11C 13/004; G11C 13/0069; G11C 2013/0045; G11C 2213/32; G11C 2213/31; G11C 2013/0078
See application file for complete search history.

(56) References Cited

U.S. PATENT DOCUMENTS

| 4,812,746 | A | | 3/1989 | Dallas |
| 4,910,706 | A | | 3/1990 | Hyatt |
| 5,687,112 | A | * | 11/1997 | Ovshinsky .............. G11C 11/56 |
| | | | | 257/3 |
| 6,301,317 | B1 | * | 10/2001 | Ben-Eli ..................... H04L 7/04 |
| | | | | 370/321 |
| 7,298,640 | B2 | | 11/2007 | Chen et al. |
| 7,639,523 | B2 | | 12/2009 | Celinska et al. |
| 7,778,063 | B2 | | 8/2010 | Brubaker et al. |
| 7,872,900 | B2 | | 1/2011 | Paz De Araujo et al. |
| 9,514,814 | B1 | | 12/2016 | Sandhu et al. |
| 9,548,118 | B1 | | 1/2017 | Bhavnagarwala et al. |
| 9,558,819 | B1 | | 1/2017 | Aitken et al. |
| 9,584,118 | B1 | | 2/2017 | Dao et al. |
| 9,589,636 | B1 | | 3/2017 | Bhavnagarwala et al. |

(Continued)

OTHER PUBLICATIONS

Notification of Transmittal of the International Search Report and the Written Opinion of the International Searching Authority, or the Declaration, App. No. PCT/GB2019/051540, dated Sep. 4, 2019, 1 Page.

(Continued)

*Primary Examiner* — Jerome Leboeuf
(74) *Attorney, Agent, or Firm* — Berkeley Law & Technology Group, LLP

(57) ABSTRACT

Methods, systems and devices for operation of non-volatile memory device are described herein. In one aspect, a signal may have an amplitude within a continuous amplitude range, and a non-volatile memory element may be placed in an impedance state representing the amplitude. The amplitude of the signal may be recovered based, at least in part, on the impedance state of the non-volatile memory element.

23 Claims, 8 Drawing Sheets

(56) References Cited

U.S. PATENT DOCUMENTS

| | | | |
|---|---|---|---|
| 9,621,161 | B1 | 4/2017 | Das et al. |
| 9,627,615 | B1 | 4/2017 | Reid et al. |
| 9,660,189 | B1 | 5/2017 | Reid et al. |
| 9,734,895 | B2 | 8/2017 | Savanth et al. |
| 9,735,360 | B2 | 8/2017 | Shifren et al. |
| 9,735,766 | B2 | 8/2017 | Shifren |
| 9,747,982 | B1 | 8/2017 | Shifren et al. |
| 9,748,943 | B2 | 8/2017 | Sandhu et al. |
| 9,755,146 | B2 | 9/2017 | Shfren et al. |
| 9,773,550 | B2 | 9/2017 | Bhavnagarwala et al. |
| 9,786,370 | B2 | 10/2017 | Aitken et al. |
| 9,792,982 | B1 | 10/2017 | Sandhu |
| 9,792,984 | B1 | 10/2017 | Bhavnagarwala et al. |
| 9,805,777 | B2 | 10/2017 | Sandhu et al. |
| 9,824,767 | B1* | 11/2017 | Mantegazza .......... G11C 16/10 |
| 9,851,738 | B2 | 12/2017 | Sandhu et al. |
| 9,871,528 | B1 | 1/2018 | Kumar et al. |
| 9,899,083 | B1 | 2/2018 | Rosendale |
| 9,947,402 | B1 | 4/2018 | Bhavnagarwala et al. |
| 9,972,388 | B2 | 5/2018 | Das et al. |
| 9,978,942 | B2 | 5/2018 | Shifren et al. |
| 9,979,385 | B2 | 5/2018 | Sandhu et al. |
| 9,990,992 | B2 | 6/2018 | Bhavnagarwala et al. |
| 9,997,424 | B2 | 6/2018 | Arvin et al. |
| 10,002,665 | B1 | 6/2018 | Bhargava et al. |
| 10,002,669 | B1 | 6/2018 | Bhargava et al. |
| 10,032,487 | B2 | 7/2018 | Shifren et al. |
| 2006/0250837 | A1* | 11/2006 | Herner .............. G11C 11/5685 365/148 |
| 2007/0159869 | A1* | 7/2007 | Baek .................. G11C 11/16 365/148 |
| 2008/0106925 | A1* | 5/2008 | Paz de Araujo ........ H01L 45/04 365/148 |
| 2008/0106926 | A1 | 5/2008 | Brubaker |
| 2008/0107801 | A1 | 5/2008 | Celinska et al. |
| 2010/0110760 | A1* | 5/2010 | Chen .................. G11C 13/004 365/148 |
| 2013/0200323 | A1 | 8/2013 | Pham et al. |
| 2013/0214232 | A1 | 8/2013 | Tendulkar et al. |
| 2013/0285699 | A1 | 10/2013 | Mcwilliams et al. |
| 2014/0078823 | A1* | 3/2014 | Kruglick ................ G11C 7/04 365/163 |
| 2014/0192585 | A1 | 7/2014 | Hashim et al. |
| 2015/0380086 | A1 | 12/2015 | Park et al. |
| 2016/0163978 | A1 | 6/2016 | Paz De Araujo et al. |
| 2017/0033782 | A1 | 2/2017 | Shifren et al. |
| 2017/0045905 | A1 | 2/2017 | Sandhu et al. |
| 2017/0047116 | A1 | 2/2017 | Sandhu et al. |
| 2017/0047919 | A1 | 2/2017 | Sandhu et al. |
| 2017/0069378 | A1 | 3/2017 | Shifren et al. |
| 2017/0092858 | A1 | 3/2017 | Shifren |
| 2017/0147207 | A1* | 5/2017 | Hansson .............. G06F 3/061 |
| 2017/0244027 | A1 | 8/2017 | Reid et al. |
| 2017/0244032 | A1 | 8/2017 | Reid et al. |
| 2017/0288675 | A1 | 10/2017 | Chandra et al. |
| 2018/0095114 | A1 | 4/2018 | Bhargave et al. |
| 2018/0108402 | A1 | 4/2018 | Das |

OTHER PUBLICATIONS

International Search Report, App. No. PCT/GB2019/051540, dated Sep. 4, 2019, 4 Pages.

Written Opinion of the International Searching Authority, App. No. PCT/GB2019/051540, dated Sep. 4, 2019, 9 Pages.

Notification of Transmittal of the International Search Report and the Written Opinion of the International Searching Authority, or the Declaration, dated Jul. 20, 2018, International Application No. PCT/GB2018/051254, 1 pg.

The International Search Report, dated Jul. 20, 2018, International Application No. PCT/GB2018/051254, 5 pgs.

The Written Opinion of the International Searching Authority, dated Jul. 20, 2018, International Application No. PCT/GB2018/051254, 10 pgs.

Edwards, Arthur H. et. al., "Reconfigurable Memristive Device Technologies", Proceedings of the IEEE, IEEE. New York, US, vol. 103. No. 7, Jul. 1, 2015 pp. 1004-1033

Notification Concerning Transmittal of International Preliminary Report on Patentability, App. No. PCT/GB2018/051254, Filed May 10, 2018, dated Nov. 21, 2019, 1 Page.

International Preliminary Report on Patentability, App. No. PCT/GB2018/051254, Filed May 10, 2018, dated Nov. 21, 2019, 1 Page.

Written Opinion of the International Searching Authority, App. No. PCT/GB2018/051254, Filed May 10, 2018, dated Nov. 21, 2019, 7 Pages.

Office Action, U.S. Appl. No. 15/591,708, dated Sep. 29, 2017, 16 Pages.

Response to Office Action, U.S. Appl. No. 15/591,708, filed Dec. 21, 2017, 17 Pages.

Notice of Allowance, U.S. Appl. No. 15/591,708, dated Feb. 2, 2018, 7 Pages.

Issue Fee and Rule 312 Amendment, U.S. Appl. No. 15/591,708, filed May 1, 2018, 10 Pages.

Supplemental Notice of Allowability, U.S. Appl. No. 15/591,708, dated May 7, 2018, 7 Pages.

Issue Notification, U.S. Appl. No. 15/591,708, dated May 30, 2018, 1 Page.

Office Action, U.S. Appl. No. 15/985,271, dated Apr. 18, 2019, 20 Pages.

Response to Office Action, U.S. Appl. No. 15/985,271, filed Jul. 18, 2019, 15 Pages.

Terminal Disclaimer and Acceptance, U.S. Appl. No. 15/985,271, filed Jul. 29, 2019, 5 Pages.

Notice of Allowance, U.S. Appl. No. 15/985,271, dated Aug. 1, 2019, 12 Pages.

Issue Fee and Rule 312 Amendment, U.S. Appl. No. 15/985,271, filed Oct. 31, 2019, 10 Pages.

Corrected Notice of Allowability, U.S. Appl. No. 15/985,271, dated Nov. 20, 2019, 11 Pages.

Response to Rule 312, U.S. Appl. No. 15/895,271, dated Nov. 6, 2019, 2 Pages.

Issue Notification, U.S. Appl. No. 15/895,271, dated Nov. 26, 2019, 1 Page.

Notification Concerning Transmittal of International Preliminary Report on Patentability, App. No. PCT/GB2019/051540 dated Dec. 24, 2020, 1 Page.

International Preliminary Report on Patentability, App. No. PCT/GB2019/051540, dated Dec. 24, 2020, 1 Page.

Written Opinion of the International Searching Authority, App. No. PCT/GB2019/051540, dated Dec. 24, 2020, 7 Pages.

\* cited by examiner

METHOD, SYSTEM AND DEVICE FOR NON-VOLATILE MEMORY DEVICE OPERATION

BACKGROUND

1. Field

Disclosed are techniques for utilizing memory devices.

2. Information

Non-volatile memories are a class of memory in which the memory cell or element does not lose its state after power supplied to the device is removed. The earliest computer memories, made with rings of ferrite that could be magnetized in two directions, were non-volatile, for example. As semiconductor technology evolved into higher levels of miniaturization, the ferrite devices were abandoned for the more commonly known volatile memories, such as DRAMs (Dynamic Random Access Memories) and SRAMs (Static-RAMs).

One type of non-volatile memory, electrically erasable programmable read-only memory (EEPROM) devices have large cell areas and may require a large voltage (e.g., from 12.0 to 21.0 volts) on a transistor gate to write or erase. Also, an erase or write time is typically of the order of tens of microseconds. One limiting factor with EEPROMs is the limited number of erase/write cycles to no more than slightly over 600,000—or of the order of $10^5$-$10^6$. The semiconductor industry has eliminated a need of a pass-gate switch transistor between EEPROMs and non-volatile transistors by sectorizing a memory array in such a way that "pages" (e.g., sub-arrays) may be erased at a time in EEPROMs called flash memory devices. In flash memory devices, an ability to keep random access (erase/write single bits) was sacrificed for higher bit density.

More recently, FeRAMs (Ferroelectric RAMs) have provided low power, relatively high write/read speed, and endurance for read/write cycles exceeding 10 billion times. Similarly, magnetic memories (MRAMs) have provided high write/read speed and endurance, but with a high cost premium and higher power consumption. Neither of these technologies reaches the density of flash memory devices, for example. As such, flash remains a non-volatile memory of choice. Nevertheless, it is generally recognized that flash memory technology may not scale easily to certain processing nodes; thus, new non-volatile memory devices capable of being scaled to smaller sizes are actively being sought.

Technologies considered for the replacement of flash memory devices have included memories based on certain materials that exhibit a resistance change associated with a change of phase of the material (determined, at least in part, by a long range ordering of atoms in the crystalline structure). In one type of variable resistance memory called a phase change memory (PCM/PCRAM) devices, a change in resistance occurs as the memory element is melted briefly and then cooled to either a conductive crystalline state or a non-conductive amorphous state. Typical materials vary and may include GeSbTe, where Sb and Te can be exchanged with other elements of the same or similar properties on the Periodic Table. However, these resistance-based memories have not proved to be commercially useful because their transition between the conductive and the insulating state depends on a physical structure phenomenon (e.g., melting at up to 600 degrees C.) and returning to a solid state that cannot be sufficiently controlled for a useful memory in many applications.

Another variable resistance memory category includes materials that respond to an initial high "forming" voltage and current to activate a variable resistance function. These materials may include, for example, $Pr_xCa_yMn_zO_\epsilon$, with x, y, z and ε of varying stoichiometry; transition metal oxides, such as CuO, CoO, $VO_x$, NiO, $TiO_2$, $Ta_2O_5$; and some perovskites, such as Cr; $SrTiO_3$. Several of these memory types exist and fall into the resistive RAMs (ReRAMs) or conductive bridge RAMS (CBRAM) classification, to distinguish them from the chalcogenide type memories. It is postulated that resistance switching in these RAMs is due, at least in part, to the formation of narrow conducting paths or filaments connecting the top and bottom conductive terminals by the electroforming process, though the presence of such conducting filaments is still a matter of controversy. Since operation of a ReRAM/CBRAM may be strongly temperature dependent, a resistive switching mechanism in a ReRAM/CBRAM may also be highly temperature dependent. Additionally, these systems may operate stochastically as the formation and movement of the filament is stochastic. Other types of ReRAM/CBRAM may also exhibit unstable qualities. Further, resistance switching in ReRAM/CBRAMs tends to fatigue over many memory cycles. That is, after a memory state is changed many times, a difference in resistance between a conducting state and an insulative state may change significantly. In a commercial memory device, such a change may take the memory out of specification and make it unusable.

SUMMARY

Briefly, one particular implementation is directed to a method comprising: receiving a signal having an amplitude within a continuous range; placing a non-volatile memory element in an analog state representing the amplitude; and recovering the amplitude based, at least in part, on the analog state.

Another particular implementation is directed to a device comprising: a storage circuit to obtain a signal having an amplitude with a continuous amplitude range; a write circuit to place a non-volatile memory element in an analog state representing the amplitude; and a read circuit to obtain a recovered amplitude value based on the analog state.

It should be understood that the aforementioned implementations are merely example implementations, and that claimed subject matter is not necessarily limited to any particular aspect of these example implementations.

BRIEF DESCRIPTION OF THE DRAWINGS

Claimed subject matter is particularly pointed out and distinctly claimed in the concluding portion of the specification. However, both as to organization and/or method of operation, together with objects, features, and/or advantages thereof, it may best be understood by reference to the following detailed description if read with the accompanying drawings in which:

Figure 1A:
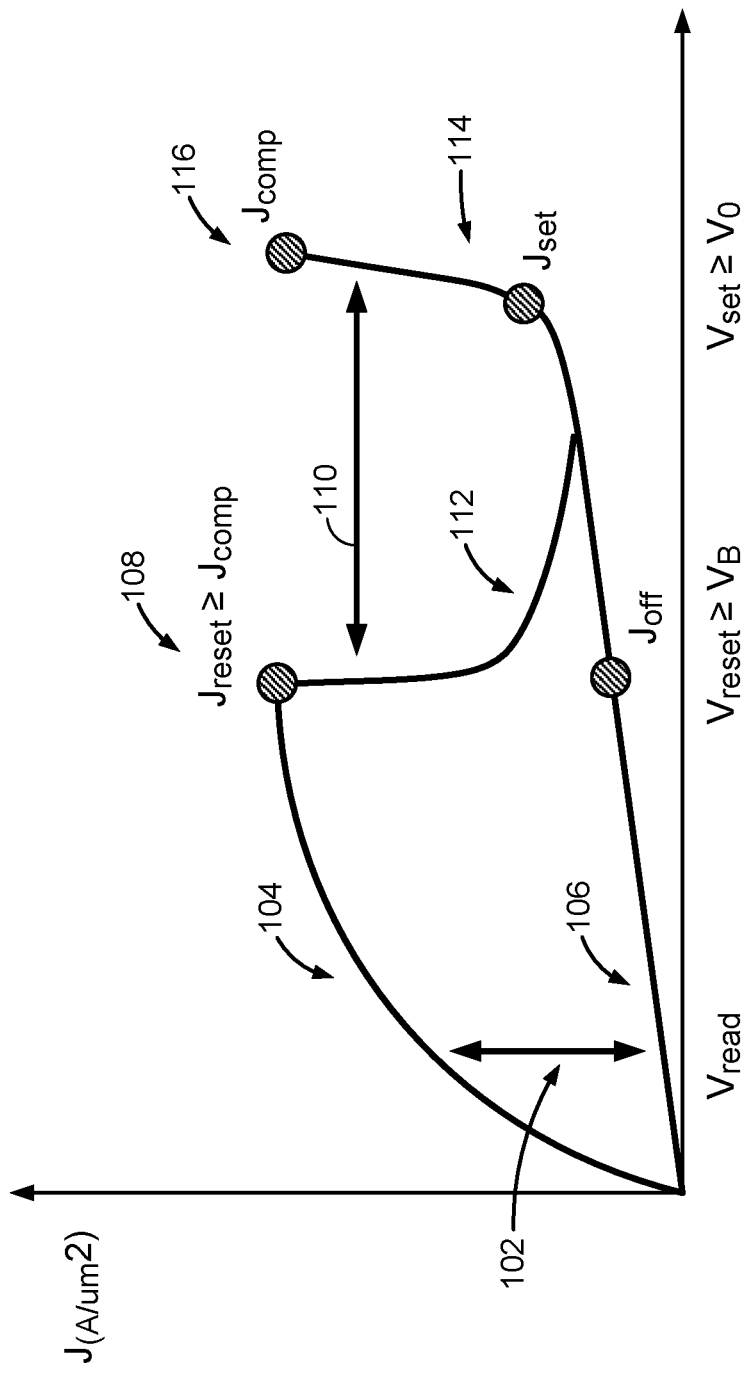
FIG. 1A shows a plot of current density versus voltage for a correlated electron switch (CES) element according to an embodiment.

Reference is made in the following detailed description to accompanying drawings, which form a part hereof, wherein like numerals may designate like parts throughout that are identical, similar and/or analogous. It will be appreciated that the figures have not necessarily been drawn to scale, such as for simplicity and/or clarity of illustration. For example, dimensions of some aspects may be exaggerated relative to others. Further, it is to be understood that other embodiments may be utilized. Furthermore, structural and/or other changes may be made without departing from claimed subject matter. References throughout this specification to "claimed subject matter" refer to subject matter intended to be covered by one or more claims, or any portion thereof, and are not necessarily intended to refer to a complete claim set, to a particular combination of claim sets (e.g., method claims, apparatus claims, etc.), or to a particular claim. It should also be noted that directions and/or references, for example, such as up, down, top, bottom, and so on, may be used to facilitate discussion of drawings and are not intended to restrict application of claimed subject matter. Therefore, the following detailed description is not to be taken to limit claimed subject matter and/or equivalents.

DETAILED DESCRIPTION

Particular aspects of the present disclosure incorporate a Correlated Electron Material (CEM) to form a correlated electron switch (CES) element. In this context, a CES element may exhibit an abrupt conductor/insulator transition arising from electron correlations rather than solid state structural phase changes (e.g., crystalline/amorphous in phase change memory (PCM) devices or filamentary formation and conduction in resistive RAM devices as discussed above). In one aspect, an abrupt conductor/insulator transition in a CES element may be responsive to a quantum mechanical phenomenon, in contrast to melting/solidification or filament formation. Such a quantum mechanical transition between conductive and insulative states in a CEM memory device may be understood in any one of several aspects.

In one aspect, a quantum mechanical transition of a CES element between an insulative state and a conductive state may be understood in terms of a Mott transition. In a Mott transition, a material may switch from an insulative state to a conductive state if a Mott transition condition occurs. The criteria may be defined by the condition $(n_c)^{1/3} a=0.26$, where $n_c$ is a concentration of electrons and "a" is a Bohr radius. If a critical carrier concentration is achieved such that the Mott criteria is met, a Mott transition may occur and state may change from a high resistance/capacitance to a low resistance/capacitance.

In one aspect, a Mott transition may be controlled by a localization of electrons. As carriers are localized, a strong coulomb interaction between electrons splits the bands of the material creating an insulator. If electrons are no longer localized, a weak coulomb interaction may dominate band splitting, leaving behind a metal (conductive) band. This is sometimes explained as a "crowded elevator" phenomenon. While an elevator has only a few people in it, the people can move around easily, which is analogous to a conducting state. While the elevator reaches a certain concentration of people, on the other hand, passengers can no longer move, which is analogous to the insulative state. However, it should be understood that this classical explanation provided for illustrative purposes, like all classical explanations of quantum phenomenon, is only an incomplete analogy, and that claimed subject matter is not limited in this respect.

In a particular implementation, a CES element may switch resistive states responsive to a Mott-transition in the majority of the volume of CEM forming the CES element. In one aspect, a CES element may comprise a material selected from a group comprising aluminum, cadmium, chromium, cobalt, copper, gold, iron, manganese, mercury, molybdenum, nickel, palladium, rhenium, ruthenium, silver, tin, titanium, vanadium, and zinc (which may be linked to a cation such as oxygen or other types of ligands), or combinations thereof.

In a particular embodiment, a CES element may be formed as a "CEM random access memory (CeRAM)" device. In this context, a CeRAM device comprises a material that may transition between or among detectable memory states based, at least in part, on a transition of at least a portion of the material between a conductive state and an insulative state utilizing the quantum mechanical Mott transition. In this context, a "memory state" means a detectable state of a memory device that is indicative of a value, symbol, state, parameter or condition, just to provide a few examples. In one particular implementation, as described below, a memory state of a memory device may be detected based, at least in part, on a signal detected on terminals of the memory device in a read operation. In another particular implementation, as described below, a memory device may be placed in a particular memory state to represent or store a particular value, symbol, state, condition or parameter by application of one or more signals across terminals of the memory device in a "write operation."

In a particular implementation, a CES element may comprise material sandwiched between conductive terminals. By applying a specific voltage and current between the terminals, the material may transition between the aforementioned conductive and insulative memory states. As discussed in the particular example implementations below, material of a CES element sandwiched between conductive terminals may be placed in an insulative or high impedance memory state by application of a first programming signal across the terminals having a voltage $V_{reset}$ and current $I_{reset}$, or placed in a conductive or low impedance memory state by application of a second programming signal across the terminals having a voltage $V_{set}$ and current $I_{set}$. In this context, it should be understood that terms such as "conductive or low impedance" memory state and "insulative or high impedance" memory state are relative terms and not specific to any particular quantity or value for impedance or conductance. For example, while a memory device is in a first memory state referred to as an insulative or high impedance memory state the memory device in one aspect is less conductive (or more insulative) than while the memory device in a second memory state referred to as a conductive or low impedance memory state. Furthermore, as discussed below with respect to a particular implementation, a CES element may be placed in any one of multiple different and distinguishable low impedance or conductive states over a continuum of low impedance or conductive states.

In a particular implementation, CeRAM memory cells may comprise a metal/CEM/metal (M/CEM/M) stack formed on a semiconductor. Such an M/CEM/M stack may be formed on a diode, for example. In an example, implementation, such a diode may be selected from the group consisting of a junction diode and a Schottky diode. In this context, it should be understood that "metal" means a conductor, that is, any material that acts like a metal, including, for example, polysilicon or a doped semiconductor.

FIG. 1A shows a plot of current density versus voltage across terminals (not shown) for a CES element according to an embodiment. Based, at least in part, on a voltage applied to terminals of the CES element (e.g., in a write operation), the CES element may be placed in a conductive state or an insulative state. For example application of a voltage $V_{set}$ and current density $J_{set}$ may place the CES element in a conductive memory state and application of a voltage $V_{reset}$ and a current density $J_{reset}$ may place the CES element in an insulative memory state. Following placement of the CES element in an insulative state or conductive state, the particular state of the CES element may be detected by application of a voltage $V_{read}$ (e.g., in a read operation) and detection of a current or current density at terminals of the CeRAM device.

According to an embodiment, the CES device of FIG. 1A may include any TMO, such as, for example, perovskites, Mott insulators, charge exchange insulators, and Anderson disorder insulators. In particular implementations, a CES device may be formed from switching materials such as nickel oxide, cobalt oxide, iron oxide, yttrium oxide, and perovskites such as Cr doped strontium titanate, lanthanum titanate, and the manganate family including praesydium calcium manganate, and praesydium lanthanum manganite, just to provide a few examples. In particular, oxides incorporating elements with incomplete d and f orbital shells may exhibit sufficient resistive switching properties for use in a CES device. In an embodiment, a CES device may be prepared without electroforming. Other implementations may employ other transition metal compounds without deviating from claimed subject matter. For example, {M(chxn)$_2$Br}Br$_2$ where M may comprise Pt, Pd, or Ni, and chxn comprises 1R,2R-cyclohexanediamine, and other such metal complexes may be used without deviating from claimed subject matter.

In one aspect, the CES device of FIG. 1A may comprise materials that are TMO metal oxide variable resistance materials, though it should be understood that these are exemplary only, and are not intended to limit claimed subject matter. Particular implementations may employ other variable resistance materials as well. Nickel oxide, NiO, is disclosed as one particular TMO. NiO materials discussed herein may be doped with extrinsic ligands, which may stabilize variable resistance properties. In particular, NiO variable resistance materials disclosed herein may include a carbon containing ligand, which may be indicated by NiO(C$_x$). Here, one skilled in the art may determine a value of x for any specific carbon containing ligand and any specific combination of carbon containing ligand with NiO simply by balancing valences. In another particular example, NiO doped with extrinsic ligands may be expressed as NiO(L$_x$), where L$_x$ is a ligand element or compound and x indicates a number of units of the ligand for one unit of NiO. One skilled in the art may determine a value of x for any specific ligand and any specific combination of ligand with NiO or any other transition metal simply by balancing valences.

If sufficient bias is applied (e.g., exceeding a band-splitting potential) and the aforementioned Mott condition is met (injected electron holes=the electrons in a switching region), the CES element may rapidly switch from a conductive state to an insulator state via the Mott transition. This may occur at point 108 of the plot in FIG. 1A. At this point, electrons are no longer screened and become localized. This correlation may result in a strong electron-electron interaction potential which splits the bands to form an insulator. While the CES element is still in the insulative state, current may generated by transportation of electron holes. If enough bias is applied across terminals of the CES element, electrons may be injected into a metal-insulator-metal (MIM) diode over the potential barrier of the MIM device. If enough electrons have been injected and enough potential is applied across terminals to place the CES element in a particular low impedance or conductive state, an increase in electrons may screen electrons and remove a localization of electrons, which may collapse the band-splitting potential forming a metal.

According to an embodiment, current in a CES element may be controlled by an externally applied "compliance" condition determined based, at least in part, on an external current limited during a write operation to place the CES element in a conductive or low impedance state. This externally applied compliance current may also set a condition of a current density for a subsequent reset operation to place the CES element in a high impedance or insulative state. As shown in the particular implementation of FIG. 1A, a current density $J_{comp}$ applied during a write operation at point 116 to place the CES element in a conductive or low impedance state may determine a compliance condition for placing the CES device in a high impedance or insulative state in a subsequent write operation. As shown, the CES device may be subsequently placed in an insulative or high impedance state by application of a current density $J_{reset} \geq J_{comp}$ at a voltage $V_{reset}$ at point 108, where $J_{comp}$ is externally applied.

The compliance therefore may set a number of electrons in a CES element which are to be "captured" by holes for the Mott transition. In other words, a current applied in a write operation to place a CES element in a conductive or insulative state may determine a number of holes to be injected to the CES element for subsequently transitioning the CES element to an insulative or high impedance state.

As pointed out above, a reset condition may occur in response to a Mott transition at point 108. As pointed out above, such a Mott transition may occur at condition in a CES element in which a concentration of electrons n equals a concentration of electron holes p. This condition may be modeled according to expression (1) as follows:

$$\lambda_{TF} n^{\frac{1}{3}} = C \sim 0.26 \qquad (1)$$

$$n = \left(\frac{C}{\lambda_{TF}}\right)^3$$

where:

$\lambda_{TF}$ is a Thomas Fermi screening length; and

C is a constant.

According to an embodiment, a current or current density in a region 104 of the plot shown in FIG. 1A may exist in response to injection of holes from a voltage signal applied across terminals of a CES element. Here, injection of holes may meet a Mott transition criterion for the conductive state to insulative state transition at current $I_{MI}$ as a critical voltage $V_{MI}$ is applied across terminals of CES element. This may be modeled according to expression (2) as follows:

$$I_{MI}(V_{MI}) = \frac{dQ(V_{MI})}{dt} \approx \frac{Q(V_{MI})}{t} \qquad (2)$$

$$Q(V_{MI}) = qn(V_{MI})$$

Where $Q(V_{MI})$ is the charged injected (hole or electron) and is a function of an applied voltage.

Injection of electron holes to enable a Mott transition may occur between bands and in response to critical voltage $V_{MI}$ and critical current $I_{MI}$. By equating electron concentration n with a charge concentration to bring about a Mott transition by holes injected by $I_{MI}$ in expression (2) according to expression (1), a dependency of such a critical voltage $V_{MI}$ on Thomas Fermi screening length $\lambda_{TF}$ may be modeled according to expression (3) as follows:

$$I_{MI}(V_{MI}) = \frac{Q(V_{MI})}{t} = \frac{qn(V_{MI})}{t} = \frac{q}{t}\left(\frac{C}{\lambda_{TF}}\right)^3 \qquad (3)$$

$$J_{reset}(V_{MI}) = J_{MI}(V_{MI}) = \frac{I_{MI}(V_{MI})}{A_{CeRam}} = \frac{q}{A_{CeRam} t}\left(\frac{C}{\lambda_{TF}(V_{MI})}\right)^3$$

Where:

$A_{CeRam}$ is a cross-sectional area of a CES element; and $J_{reset}(V_{MI})$ is a current density through the CES element to be applied to the CES element at a critical voltage $V_{MI}$ to place the CES element in an insulative state.

According to an embodiment, a CES element may be placed in a conductive memory state (e.g., by transitioning from an insulative memory state) by injection of a sufficient number of electrons to satisfy a Mott transition criteria.

In transitioning a CES to a conductive memory state, as enough electrons have been injected and the potential across terminal of the CES device overcomes a critical switching potential (e.g., $V_{set}$), injected electrons begin to screen and unlocalize double-occupied electrons to reverse a disproportion reaction and close the bandgap. A current density $J_{set}(V_{MI})$ for transitioning the CES to the conductive memory state at a critical voltage $V_{MI}$ enabling transition to the conductive memory state may be expressed according to expression (4) as follows:

$$I_{MI}(V_{MI}) = \frac{dQ(V_{MI})}{dt} \approx \frac{Q(V_{MI})}{t} \qquad (4)$$

$$Q(V_{MI}) = qn(V_{MI})$$

$$I_{MI}(V_{MI}) = \frac{Q(V_{MI})}{t} = \frac{qn(V_{MI})}{t} = \frac{q}{t}\left(\frac{C}{a_B}\right)^3$$

$$J_{set}(V_{MI}) = J_{injection}(V_{MI}) = J_{MI}(V_{MI}) = \frac{I_{MI}(V_{MI})}{A_{CeRam}} = \frac{q}{A_{CeRam} t}\left(\frac{C}{a_B}\right)^3$$

where:

$a_B$ is a Bohr radius.

According to an embodiment, a "read window" 102 for detecting an impedance state of a CES element in a read operation may be set out as a difference between a portion 106 the plot of FIG. 1A while the CES element is in an insulative state and a portion 104 of the plot FIG. 1A while the CES element is in a conductive state at a read voltage $V_{read}$. In a particular implementation, read window 102 may be used to determine a Thomas Fermi screening length $\lambda_{TF}$ of material making up the CES element. For example, at a voltage $V_{reset}$, current densities $J_{reset}$ and $J_{set}$ may be related to according to expression (5) as follows:

$$\lambda_{TF}(@V_{reset}) = a_B\left(\frac{J_{reset}}{J_{off}}\right)^{\frac{1}{3}} \qquad (5)$$

In another embodiment, a "write window" 110 for placing a CES element in an insulative or conductive memory state in a write operation may be set out as a) difference between $V_{reset}$ (at $J_{reset}$) and $V_{set}$ (at $J_{set}$). Establishing $|V_{set}|>|V_{reset}|$ enables a switch between conductive and insulative state. $V_{reset}$ may be approximately at a band splitting potential arising from correlation and $V_{set}$ may be approximately twice the band splitting potential. In particular implementations, a size of write window 110 may be determined based, at least in part, by materials and doping of the CES element.

Figure 1B:
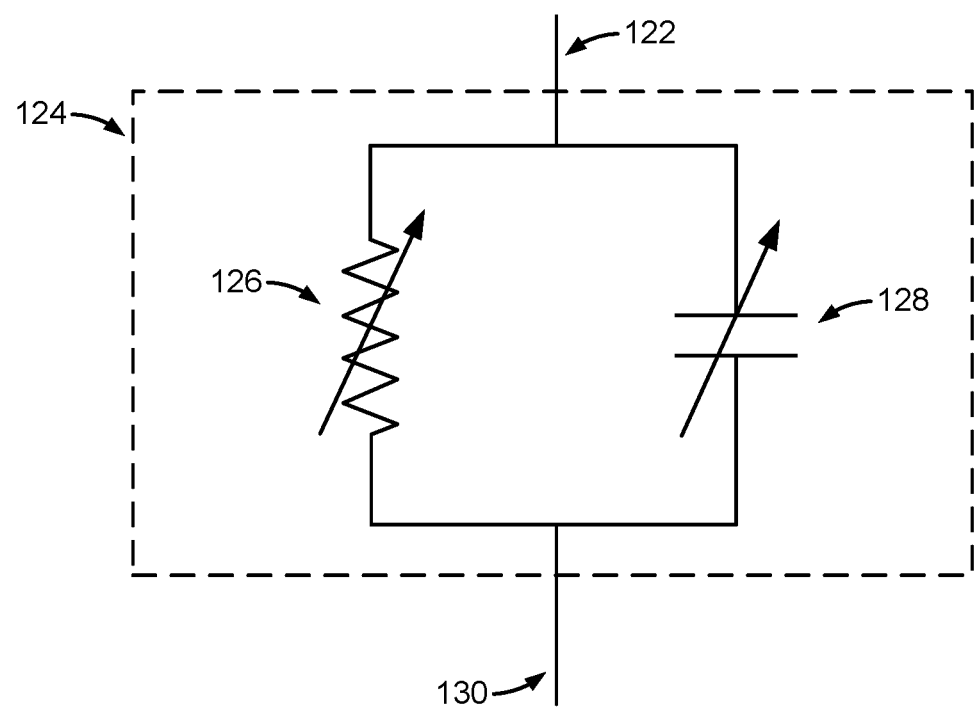
FIG. 1B is a schematic diagram of an equivalent circuit to a CES element according to an embodiment.

The transition from high resistance/capacitance to low resistance/capacitance in a CES element may be represented by a singular impedance of the CES element. FIG. 1B depicts a schematic diagram of an equivalent circuit of an example variable impedance device (such as a CES element), such as variable impeder device 124. As mentioned, variable impeder device 124 may comprise characteristics of both variable resistance and variable capacitance. For example, an equivalent circuit for a variable impeder device may, in an embodiment, comprise a variable resistor, such as variable resistor 126 in parallel with a variable capacitor, such as variable capacitor 128. Of course, although a variable resistor 126 and variable capacitor 128 are depicted in FIG. 1B as comprising discrete components, a variable impeder device, such as variable impeder device 124, may comprise a substantially homogenous CEM element, wherein the CEM element comprises characteristics of variable capacitance and variable resistance. Table 1 below depicts an example truth table for an example variable impeder device, such as variable impeder device 100.

TABLE 1

| Resistance | Capacitance | Impedance |
|---|---|---|
| $R_{high}(V_{applied})$ | $C_{high}(V_{applied})$ | $Z_{high}(V_{applied})$ |
| $R_{low}(V_{applied})$ | $C_{low}(V_{applied}) \sim 0$ | $Z_{low}(V_{applied})$ |

In the particular implementation of a CES element of FIG. 1A, the CES element may be placed in either of two different impedance states: a low impedance or conductive state responsive to a set operation and a high impedance or insulative state responsive to a reset operation.

Write operations to place a CES element in a particular impedance state, using either a SET or RESET operation, typically entails application of a programming signal to terminals of the CES element imparting a voltage and a current. Thus in an attempt to write values to a portion of a CeRAM memory array, each CES element to represent a bit value in the portion of the CeRAM memory array may consume an incremental amount of energy. In certain implementations such as in a small computing device powered by a battery (e.g., an Internet of Things (IoT) device), this incremental amount of energy may deplete energy stored in the battery. Other operations depleting energy stored in a battery of a small computing device may include digitizing analog signals by, for example, sampling an amplitude of an analog signal at one or more time instances. Such a sampled amplitude may be expressed as a digital value having one or more bits to, for example, be stored in a memory device (e.g., one or more CES elements) for additional future processing.

According to an embodiment, a small battery-powered computing device may include devices capable of capturing renewable energy for recharging a battery under certain conditions. For example, a small battery-powered computing device may include one or more solar cells, small wind generators, etc., to supply electrical energy for recharging the battery during "energy rich" conditions (e.g., presence of wind and sunlight) to be used/discharged to perform operations during "energy lean" or "energy scarce" conditions (e.g., absence of wind and sunlight available for powering a device or recharging a battery).

Particular embodiments are directed to, among other things, reducing energy consumption at computing devices during energy lean or energy scarce conditions. As pointed out above, digitizing analog signals (e.g., analog signal generated by a sensor device) may deplete battery resources of a small computing device. One particular implementation is directed to reducing operations to digitize analog signals at a small computing device during energy lean or energy scarce conditions.

As discussed above, a small computing device may employ volatile and non-volatile memory elements to maintain a state representing a particular stored value, symbol, parameter, condition or state. In an implementation, a volatile or non-volatile memory element may represent a particular stored value, symbol, parameter, condition or state from among a finite number of discrete states. For example, a non-volatile memory element may maintain a binary state to represent exactly one of two different discrete stored values, symbols, parameters, conditions or states. In a particular implementation of a non-volatile memory element as a correlated electron switch (CES) element, a CES element may represent or express either of two different discrete stored values, symbols, parameters, conditions or states as maintaining either a high impedance or insulative state, or a low impedance or conductive state. In another particular implementation, a CES element may maintain any one of three or more impedance states to express any one of three or more particular discrete stored values, symbols, parameters, conditions or states.

In one particular implementation, a CES element may maintain a particular impedance state expressing a particular stored value, symbol, parameter, condition or state α as one of a discrete number of particular values, symbols, parameters, conditions or states. In this context, α may be a member of a set containing a finite and countable number of particular values, symbols, parameters, conditions or states in a set of particular values, symbols, parameters, conditions or states. Such a set of particular finite and countable set of values, symbols, parameters, conditions or states may comprise, for example, a set of binary values, symbols, parameters, conditions or states (e.g., {0,1}, {true,false}, etc.). Such a set of particular finite and countable set of values, symbols, parameters, conditions or states may also comprise, for example, a set of m-ary values, symbols, parameters, conditions or states (e.g., {0, 1, 3, 4}, etc.).

According to an embodiment, a discrete stored value, symbol, parameter, condition or state α to be represented as a state of a memory element may be initially obtained from sampling and/or digitizing an analog signal. As pointed out above, sampling and/or digitizing an analog signal may consume battery resources during an energy scarce or energy lean condition. According to an embodiment, a memory element such as a CES element may be placed in a particular impedance state to represent an analog signal which has not been sampled and digitized. This may reduce or eliminate a need for performing sampling and/or digitization of analog signals at a computing device during energy scarce or energy lean conditions. According to an embodiment, a CES element may be placed in a particular impedance state to represent a particular analog value, symbol, parameter, condition or state β within a continuous range of analog values, symbols, parameters, conditions or states. In this context, β may be a member of an infinite number of particular values, symbols, parameters, conditions or states in a set of particular values, symbols, parameters, conditions or states over the continuous range of values, symbols, parameters, conditions or states. For example, β may be defined such that $\beta \in a < R < b$, where a and b define endpoints of a continuous range of values, symbols, parameters, conditions or states mapped to real numbers R.

Figure 2:
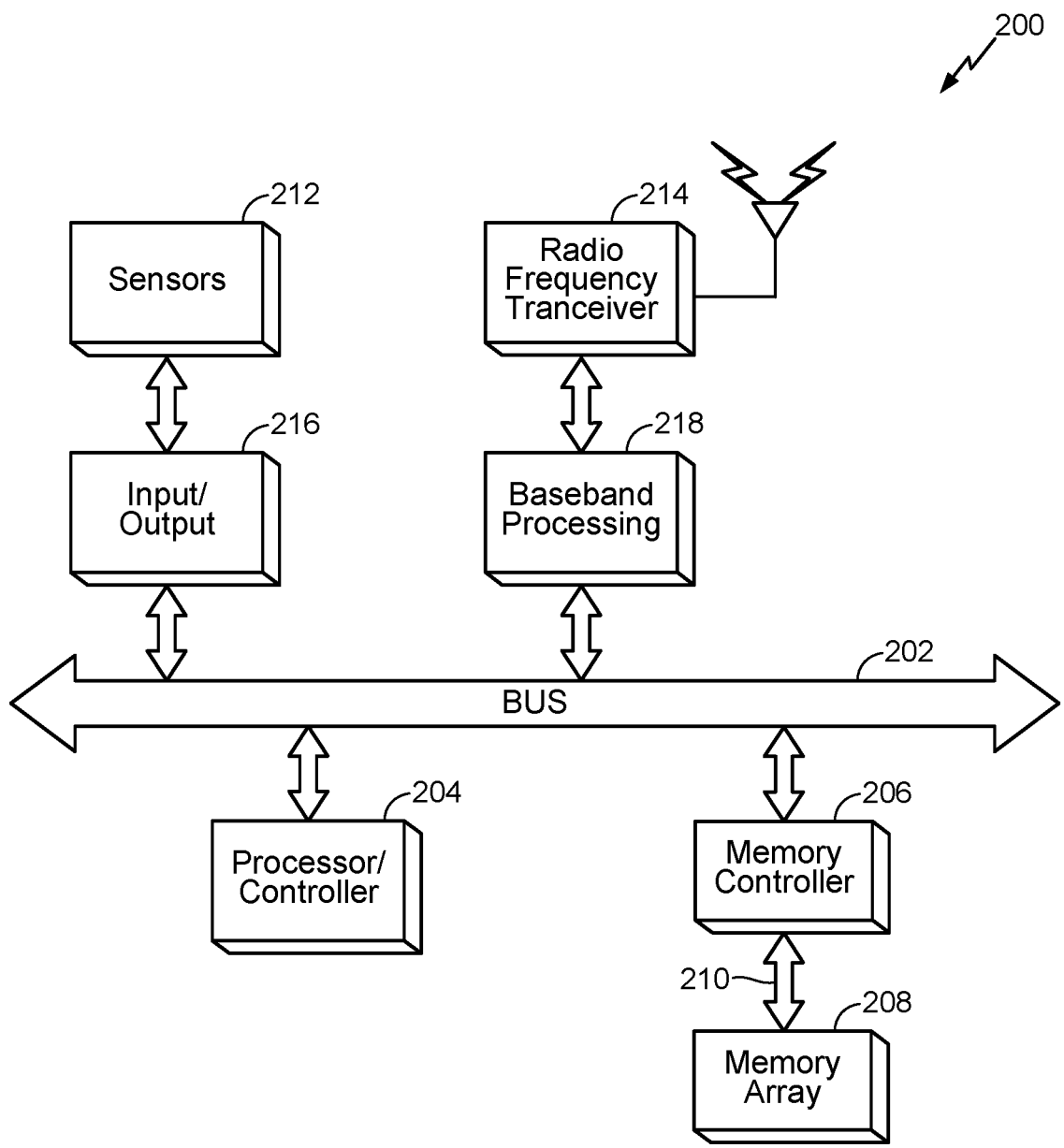
FIG. 2 is a schematic diagram of a computing device according to an embodiment.

FIG. 2 is a schematic diagram of a computing device 200 according to an embodiment. A processor/controller 204 may execute processes or procedures (e.g., under control of computer-readable instructions) to perform various tasks including, for example, storing values in or reading values from addressable portions of memory array 208. In a particular implementation, processor/controller 204 may communicate with a memory controller 206 through bus 202 according to a predefined interface. Processor/controller 204 may provide commands (e.g., specifying a physical memory address) to memory controller 206 to write values to or read values from an addressable portion of memory array 208.

Memory array 208 may comprise one or more volatile or non-volatile memory devices including, for example, a memory array comprising CES elements as described above. Processor/controller 204, memory controller 206 and memory array 208 may be formed as separate components or integrated together in a system-on-a-chip (SoC) along with other components such as sensors 212, radio frequency (RF) transceiver 214, user interface (not shown) or renewable energy collection devices (not shown). Furthermore, processor/controller 204, memory controller 206 and memory array 208 may be formed from any one of several different process technologies including, for example, CEM processes discussed above and complementary metal oxide semiconductor (CMOS) processes.

In a particular implementation, particular components of computing device 200 may sample an analog signal to be converted to a digital signal. For example, input/output device 21 may sample an analog signal generated by sensor 212 to obtain a digital representation of the amplitude of the analog signal at a sampling instance. Similarly, baseband processing device 218 or radio frequency transceiver 214 may sample an amplitude of a received radio frequency signal at an instance to obtain a digital representation. These digital representations of sampled amplitudes of analog signals may be stored in memory array 208 following write operations initiated by memory controller 206, for example.

As pointed out above, sampling amplitudes of analog signals to obtain digital representations may consume substantial battery resources of a computing device. As discussed below, particular implementations are directed to placing a non-volatile memory element in a particular analog state to represent an amplitude of an analog signal over a continuous range of signal amplitudes. While a sample and hold circuit may store a value as a capacitor voltage, such a sample and hold circuit may experience leakage over time, distorting the stored value. A non-volatile memory element, on the other hand, may maintain an analog state (representing an amplitude of an analog signal) for an extended duration (e.g., days, weeks or months, etc.) or indefinitely, even if power is removed from the non-volatile memory element. This may enable reducing operations to sample and obtain digital representations of signal amplitudes during energy lean or energy scarce conditions. Instead, during energy lean or energy scarce conditions, sampled characteristics of an analog signal (e.g., amplitude) may be stored in an analog format. Characteristics stored in the analog format may then be converted to a digital expression following a transition to an energy rich condition. It should be understood that transition from a an energy lean or scarce condition to an energy rich condition is merely an example of a change in a power condition that may initiate conversion of a stored analog amplitude to a digital representation, and claimed subject matter is not limited in this respect.

In another embodiment, a computing device may convert a stored analog amplitude value to a digital representation following a change in an environmental condition (e.g., detected by sensors such as sensors 212). For example, a computing device may convert a stored amplitude to a digital representation following a change in in an ambient temperature, ambient acoustical vibration, ambient radio frequency signals, ambient light or atmospheric pressure, or a combination thereof.

In another embodiment, storing a sampled amplitude of an analog signal as an analog state in a single non-volatile memory element may enable storage of more than a single bit of information in the single memory element. For example, storing such a sampled amplitude as an analog state in a single non-volatile memory element may enable a "compression" of a value that may otherwise be stored in a digital format using multiple memory elements.

In another embodiment, a non-volatile memory element may be implemented as a "buffer" to store a sampled amplitude of an analog signal as an analog state quickly and to enable recovery of the sampled amplitude at a later time and/or at a slower rate.

According to an embodiment, a non-volatile memory element to store a sampled amplitude of an analog signal as an analog state may comprise a CES element having characteristics described above and as illustrated in FIG. 3. It should be understood, however, that a CES element is merely an example of a non-volatile memory element that may store a sampled amplitude of an analog signal as an analog state, and claimed subject matter is not limited in this respect. In a particular implementation, FIG. 3 may characterize behavior of a memory element during read and write operations according to an embodiment. In a particular implementation, and as discussed below, FIG. 3 may characterize behavior of a memory element ME in the circuits of the schematic diagrams of FIGS. 7A, 7B and 8 according to a particular implementation in which memory element ME comprises a CES element. Again, other types of non-volatile memory elements may be used without deviating from claimed subject matter. As shown in the particular illustrated embodiment, a CES element may be placed in a high impedance or insulative, or in any particular low impedance or conductive state over a continuous range of low impedance or conductive states. The CES element of FIG. 3 may be placed in a particular low impedance or conductive state by application of a programming signal to terminal of the CES element having a voltage in range 314 in a set operation, or placed in a high impedance or insulative state by application of a programming signal having a voltage in region 312.

Figure 3:
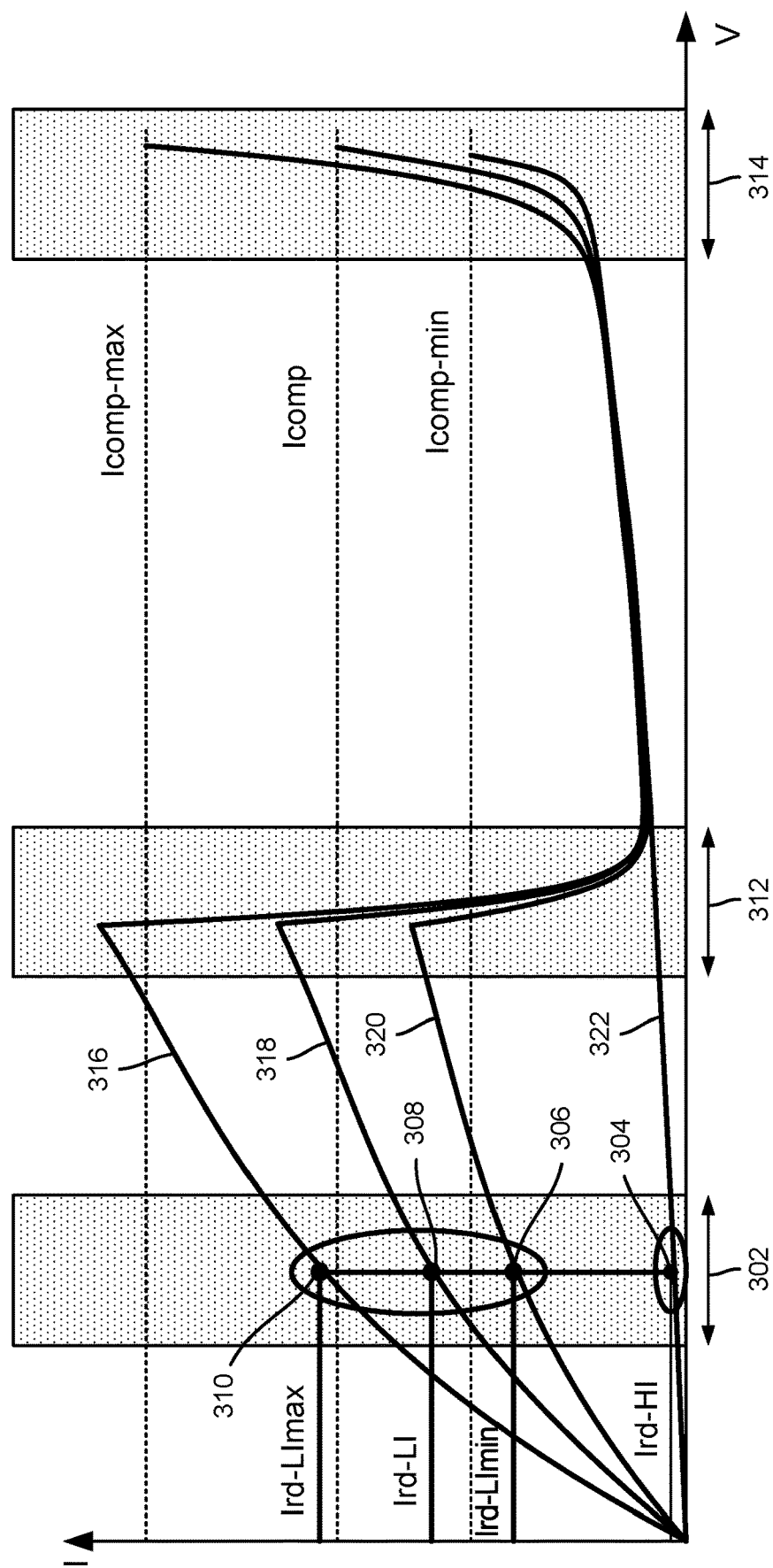
FIG. 3 is a plot of current density versus voltage for a CES element capable of being in any one of multiple impedance states over a continuous range of impedance states according to an embodiment.

The CES element of FIG. 3 may be placed in a high impedance or insulative state in a write operation by application of a programming signal on terminals of the CES element having a voltage $V_{reset}$ and current $I_{reset}$. As pointed out above, to successfully place the CES element of FIG. 3 in the high impedance or insulative state in a reset operation, a programming signal applied to the CES may comprise a voltage $V_{reset}$ at reset window 312 and a current $I_{reset}$ exceeding a current of a previous programming to place the CES element of FIG. 3 in a low impedance or insulative state in a set operation. Behavior of the CES element of FIG. 3 following such a reset operation placing the CES element in a high impedance or insulative state may be modeled according to plot 322.

Additionally, a set operation may place the CES of FIG. 3 in any particular distinguishable low impedance or conductive state over a continuous range of low impedance or conductive states. In the presently illustrated embodiment, the CES element of FIG. 3 may be placed in any particular impedance state over a range of impedance states by controlling a current Icomp (or corresponding current density) in the CES element during a set operation while a voltage is applied to terminals of the CES element over a voltage range 314. According to an embodiment, in a particular set operation a current Icomp may vary within a range Icomp–min<Icomp<Icomp–max to place the CES element a corresponding particular distinguishable low impedance or conductive states within a continuous range of possible low impedance or conductive states.

As pointed out above, a CES may comprise correlated electron material (CEM) formed between terminals. In one aspect, different low impedance or conductive states of a CES may be distinguishable, at least in part, by a density of or degree of concentration of electrons in the CEM formed between terminals of the CES following a set operation. Here, a higher density of or concentration of electrons in a CEM formed in a CES may impart a lower impedance or higher conductivity. For example, a first low impedance or conductive state of a CES (e.g., following a first SET operation) may have a first density of or concentration of localization of electrons in CEM while second low impedance or conductive state of the CES (e.g., following a second SET operation) may have a second density or concentration of electrons in the CEM. If the first density of or concentration of electrons is higher than the second density or concentration of electrons, the first low impedance or conductive state may exhibit a higher conductivity/lower impedance than the second low impedance or conductive state. As discussed herein, a difference in impedance of the first and second low impedance or conductive states may enable a detectable distinction between different memory states (e.g., representing different values, parameters, states, conditions or symbols).

According to an embodiment, a programming signal applied to terminals of the CES element of FIG. 3 in a set operation may have a voltage $V_{set}$ in set range 314. To place the CES element of FIG. 3 in a particular distinguishable low impedance or conductive state, a programming signal in a set operation may apply a current Icomp between terminals of the CES within a continuous range Icomp-min<Icomp<Icomp-max. For example, application of a programming signal having a voltage $V_{set}$ while maintaining a current Icomp-max between terminals of the CES of FIG. 3 may place the CES in an impedance state modeled by plot 316. Likewise, application of a programming signal having a voltage $V_{set}$ while maintaining a current Icomp-min between terminals of the CES of FIG. 3 may place the CES in an impedance state modeled by plot 320. Finally, application of a programming signal having a voltage $V_{set}$ while maintaining a current Icomp in a range Icomp-min<Icomp<Icomp-max between terminals of the CES of FIG. 3 may place the CES in an impedance state modeled by plot 318.

According to an embodiment, any particular impedance state within a continuous range of impedance states, including conductive or low impedance states modeled by plot 318, may be detectable by application of a read voltage $V_{read}$ at range 302 in a read window. According to an embodiment, read signal having voltage $V_{read}$ may be applied in a read operation to the CES of FIG. 3. A sense circuit may associate a current through the CES element of FIG. 3 occurring responsive to application of the read signal (in a continuous range Ird−LImin<Ird−LI<Ird−LImax) with an impedance state over a continuum of impedance states. As such, the CES element having behavior illustrated by FIG. 3 may be placed in a particular low impedance or insulative state $V_{read}/(Ird-LI)$ over a continuous range of low impedance or insulative states $V_{read}/(Ird-LImax)<V_{read}/(Ird-LI)<V_{read}/(Ird-LImin)$. As discussed below, detection or measurement of such a current Ird_LI responsive to application of the read signal may map to a particular stored value, symbol, parameter, condition or state within a continuous range of stored values, symbols, parameters, conditions or states.

Figure 4:
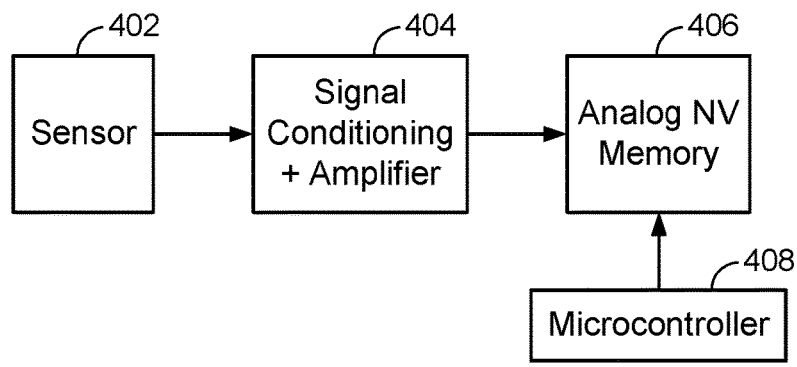
FIGS. 4, 5 and 6 are schematic diagrams of systems to apply an impedance state of a memory element representing a value, parameter, symbol or condition over a continuous range of values, parameters, symbols or conditions according to particular embodiments.
Figure 5:
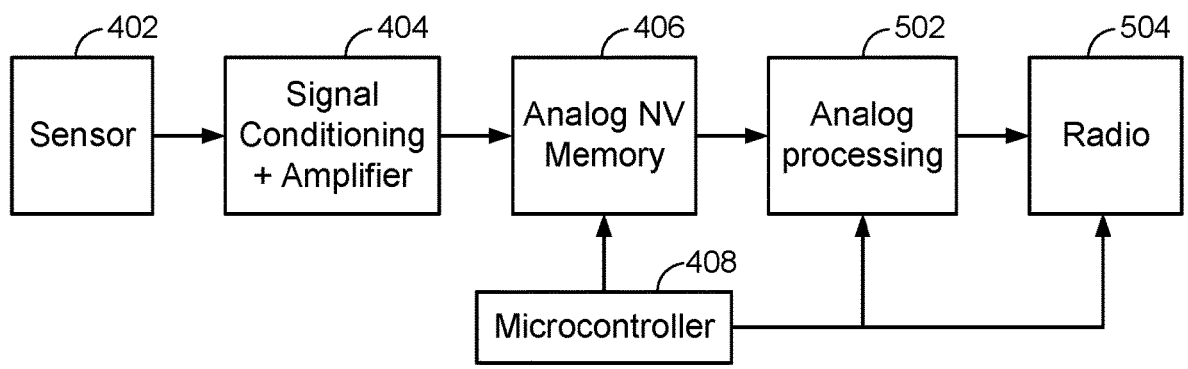
Figure 6:
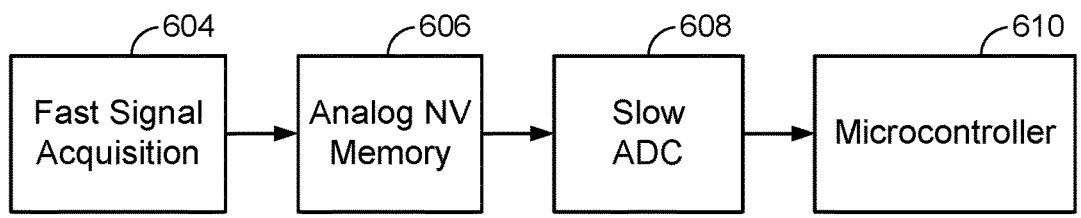

FIGS. 4, 5 and 6 are schematic diagrams of systems to apply an impedance state of a memory element representing a value, parameter, state, symbol or condition over a continuous range of values, parameters, symbols or conditions according to particular embodiments. In FIGS. 4 and 5, an analog non-volatile memory 406 may store a value representing an amplitude of a signal over a continuous range as described above. In a particular implementation in which non-volatile memory 406 comprises a CES element having characteristics illustrated in FIG. 3. For example, a CES element in non-volatile memory 406 may store a value representing an amplitude of a signal as a particular low impedance state in a continuous range of possible low impedance states by application of a current Icomp to the CES element (or corresponding current density in a portion of the CES element) in a range Icomp-min<Icomp<Icomp-max while maintaining a voltage in a range 314. The stored value representing the amplitude of the signal may then be recovered from a magnitude of a current Ird−LI in a continuous range Ird−LImin<Ird−LI<Ird−LImax while a read voltage in range 302 is applied.

In one implementation, sensor 402 may generate a signal current having an amplitude within a particular range. The signal current generated by sensor 402 may be further processed at signal conditioner and amplifier 404 (e.g., to perform amplitude or gain control and/or low pass filtering) while maintaining the processed signal in an analog form having an amplitude in a continuous range. For example, signal conditioner and amplifier 404 may provide a signal Icomp to be applied to a CES element as an analog non-volatile memory to be in a continuous range Icomp-min<Icomp<Icomp-max, placing the CES element in a detectable impedance state $V_{read}/Ird-LI$ in a continuous range of low impedance states $V_{read}/Ird-LImax<V_{read}/Ird-LI<V_{read}/Ird-LImin$. Responsive to commands or control signals from a microcontroller 408, analog non-volatile memory 406 may then store the processed signal in an analog form over a continuous range as described above. In one particular implementation, microcontroller 408 may issue command signals to analog non-volatile memory 406 initiating a storing of samples of an amplitude of the processed signal obtained signal conditioner and amplifier 404 at particular signal sample times. According to an embodiment, analog non-volatile memory 406 may store a sample of the amplitude of the processed signal in a single non-volatile memory element (e.g., a CES element) over a continuous range as described above in FIG. 3.

In one embodiment, analog non-volatile memory 406 may store amplitudes of a processed signal provided by signal conditioner and amplifier 404 in the presence of an energy scarce or energy lean condition. Maintaining analog samples of the processed signal stored in analog non-volatile memory 406 may enable delay of more energy intensive operations or computation such as analog to digital conversion for obtaining a digital representation of the analog samples or transmitting the analog samples in messages over a radio frequency communication medium. Such a delay may enable performing the more energy intensive operations or computations during an energy rich condition, for example. For example, during an energy rich condition, energy intensive computations and operations may resume. Here, a voltage $V_{read}$ may be applied to retrieve a value of an amplitude sample stored during an energy lean or energy scarce condition.

One example of processing analog signals stored in analog non-volatile memory 406 is illustrated in FIG. 5. Here, samples of amplitudes of the processed signal stored in analog non-volatile memory 406 may be retrieved and further processed by applying retrieved analog signals to the modulation of an RF signal transmitted by radio device 504. In one example implementation, microcontroller 408 may, in response to detecting a presence of an energy rich condition for example, provide control signals to initiate retrieval of samples of amplitudes of the processed signal stored in analog non-volatile memory 406 (e.g., as discussed above for a CES element behaving as illustrated in FIG. 3), initiate further processing of the retrieved samples at analog processing 502 and initiate transmission by radio 504 over an air interface. For example, a sampled amplitude of an analog signal stored or represented as a low impedance or conductive state of a CES element in analog non-volatile memory 406 may be read or detected by a current in a continuous range (Ird−LI in a continuous range Ird−LImin<Ird−LI<Ird−LImax as shown in FIG. 3) responsive application of a read voltage $V_{read}$ (e.g., in a range 302 shown in FIG. 3). In one particular implementation, analog processing 502 may comprise, for example, low pass filtering, amplification or insertion of baseband control symbols, just to provide a few examples of operations to be performed by analog processing 502. Radio 504 may then mix the signal provided by analog processing 502 with one or more oscillating signals for transmission in the RF medium.

In the particular implementation of FIG. 6, fast signal acquisition 604 may comprise any one of several components capable of processing an analog signal (e.g., generated by a sensor such as sensor 402 or analog signal received at an RF receiver). In one embodiment, fast signal acquisition 604 may process an analog signal in the presence of an energy lean or energy scarce condition for delay of energy intensive computations or operations until the presence of an energy rich condition. In an example, analog non-volatile memory 606 may store samples of an amplitude of an analog signal in non-volatile memory elements such as CES elements (e.g., as described above in FIG. 3 and in connection with storing amplitudes of analog signals in analog non-volatile memory 406). According to an embodiment, non-volatile memory 606 may comprise a CES element configured to store a sample of an amplitude of an analog signal rapidly by, for example, application of a programming signal to the CES element in a set operation as described above. Samples of the amplitude of the analog signal stored in analog non-volatile memory 606 may then be sampled at slow analog-to-digital converter (ADC) 608 to provide digital (e.g., floating point) expressions of the stored amplitudes (e.g., expressed in states of multiple volatile memory elements, each state of a volatile memory element storing a binary value) for use by microcontroller 610. In one example, a sampled amplitude of an analog signal represented as a low impedance or conductive state of a CES element (e.g., in a continuous range of low impedance states $V_{read}/Ird-LImax<V_{read}<V_{read}/Ird-LImin$) may be read or detected by a current in a continuous range (Ird-LI in a continuous range Ird-LImin<Ird-LI<Ird-LImax as shown in FIG. 3) responsive application of a read voltage (e.g., in a range 302 shown in FIG. 3).

Figure 7A:
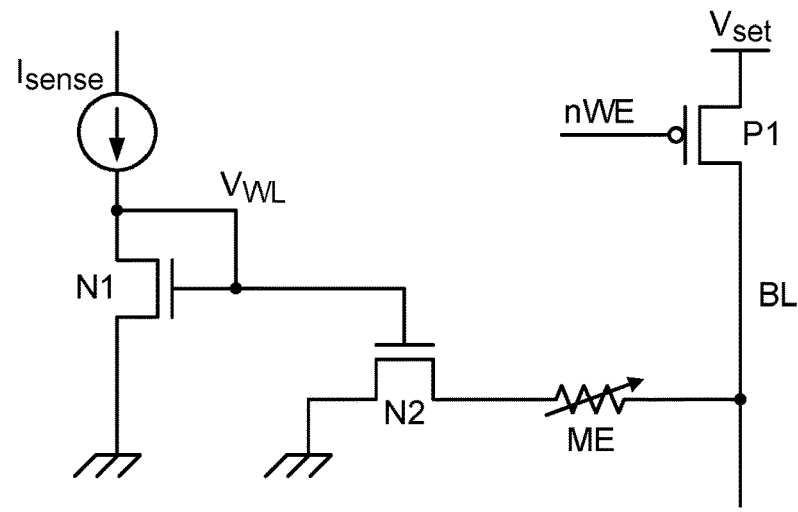
FIGS. 7A and 7B are schematic diagrams of circuits to place a memory element in a particular impedance state to represent a value, parameter, state or condition within a continuous range of values according to an embodiment.
Figure 7B:
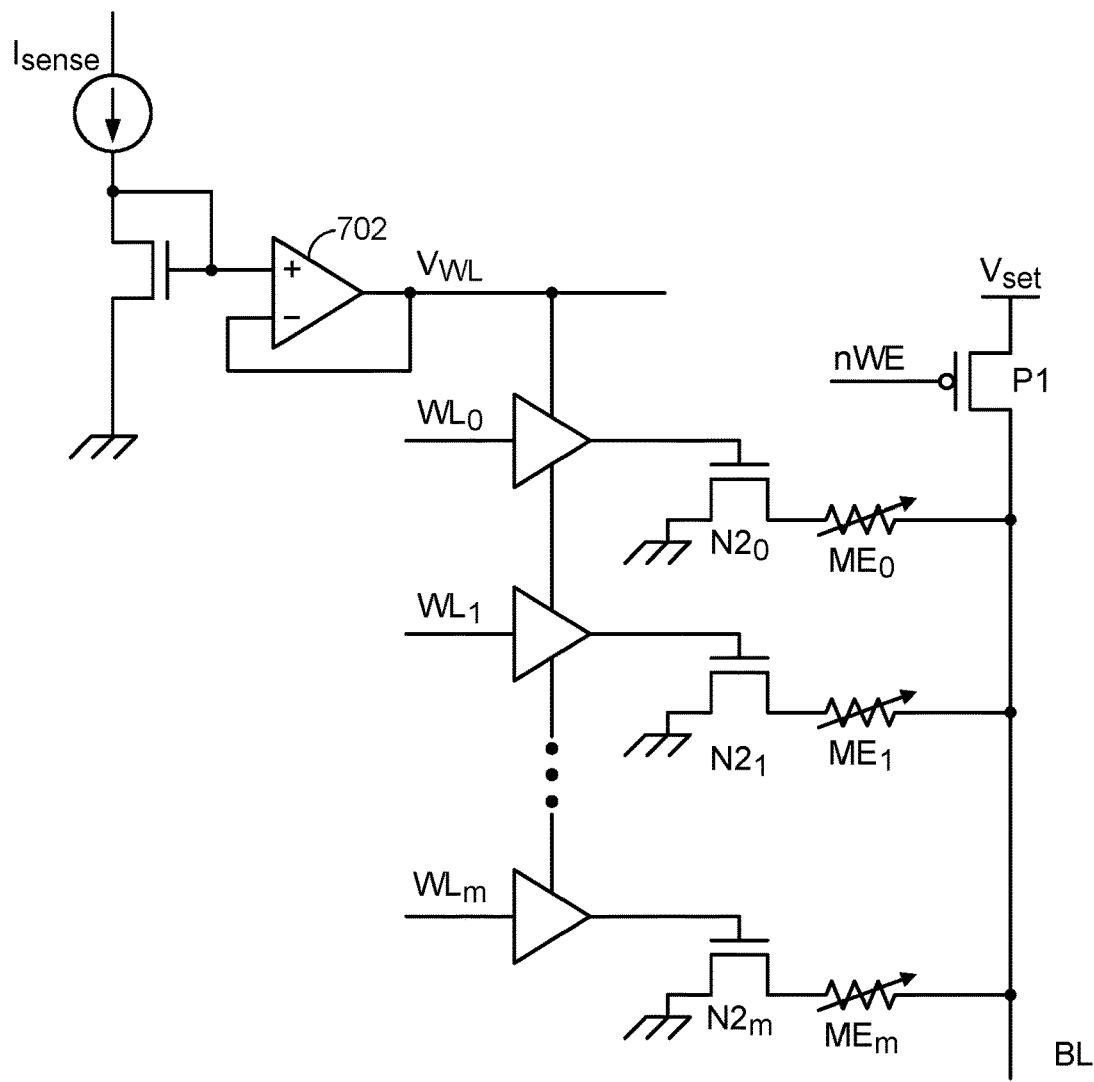

FIGS. 7A and 7B are schematic diagrams of circuits to place a memory element in a particular impedance state to represent a value, symbol, parameter, state or condition within a continuous range of values, symbols, parameters, states or conditions according to an embodiment. In FIG. 7A, a current $I_{sense}$ may comprise an amplitude that is representative of (e.g., substantially proportional to) an amplitude of an analog signal (e.g., an analog signal generated by sensor 402 or fast acquisition 604). Here, the amplitude of $I_{sense}$ may drive a wordline voltage $V_{WL}$ which is applied to a gate terminal of access NFET N2. In the particular implementation in which memory element ME comprises a CES element behaving as illustrated in FIG. 3, wordline voltage $V_{WL}$ applied to the gate terminal of access NFET N2 may control a current or current density in the CES element such that a current Icomp in the CES element is in a continuous range Icomp-min<Icomp<Icomp-max during a SET operation. According to an embodiment, access NFET N2 may be sized such that a current Icomp in a SET operation is substantially proportional to $I_{sense}$ as $I_{sense} \approx x*Icomp$ where x is a constant. Here, access NFET N2 may be sized as 1/x.

According to an embodiment, an amplitude of an analog signal (e.g., as represented by an amplitude of $I_{sense}$) may be sampled and stored in memory element ME (e.g., comprising a CES element behaving according to FIG. 3) by lowering a voltage of signal nWE connecting voltage $V_{set}$ to a terminal of memory element ME through bitline BL. Here, connecting voltage $V_{set}$ (e.g., applying a voltage to terminals in a range 314) may enable placing memory element ME in a particular low impedance or conductive state (within a particular continuous range of impedance states) determined by a magnitude of current Icomp representing an amplitude of current $I_{sense}$.

FIG. 7B is an illustration of how features of the embodiment of FIG. 7A may be expanded to an array of memory elements ME0 through MEm. In one example, the particular implementation of FIG. 7B may enable storage of a sequence of temporal samples of an amplitude of an analog signal represented by an amplitude of current $I_{sense}$. Responsive to a magnitude of current $I_{sense}$, unity gain buffer 702 may generate voltage signal $V_{WL}$ to be applied wordlines WL0, WL1, . . . , WLm, one at a time as a voltage of nWE is lowered, connecting voltage $V_{set}$ to terminals of memory elements $ME_0$ through $ME_m$ through bitline BL. By applying voltage signal $V_{WL}$ to wordlines WL0 through WLm in a sequence while voltage $V_{set}$ is connected to bitline BL, samples of an amplitude of an analog signal represented as the amplitude of current $I_{sense}$ may be stored in memory elements $ME_0$ through $ME_m$.

In one particular implementation, memory elements $ME_0$ through $ME_m$ may be used to store analog samples of a signal amplitude at corresponding sample times or sampling events 0, 1, . . . , m. Also, it should be appreciated that, in the particular embodiments of FIGS. 7A and 7B, a sampled signal amplitude may be stored or captured as an analog value in a single memory element where a sampled signal stored or captured as a digital value (e.g., in a floating point format) may entail storage in several memory elements.

As described in particular implementations herein, a voltage signal having a voltage level for a programming signal to place a memory device in a predetermined memory state may be selected at a signal selection circuit. Conducting elements connected to the signal selection circuit may selectively connect the voltage signal to or disconnect the voltage signal from the memory device at a current level corresponding to the predetermined memory state based, at least in part, on the data signal. In this context, a "conducting element" comprises a circuit element capable of permitting current to pass between two nodes. In a particular implementation, a conducting element may vary a current permitted to pass between nodes based, at least in part, on a particular condition. The particular implementations described below employ FETs as conducting elements to permit current to pass between source and drain terminals based, at least in part, on a voltage applied to a gate terminal. It should be understood, however, that other types of devices such as a bipolar transistor, diode, variable resistor, etc. may be used as a conducting element, and that claimed subject matter is not limited in this respect. In this context, a conducting element having first and second terminals may "connect" the first and second terminals by providing a conductive path between the first and second terminals having a very small or negligible impedance for a particular signal. In one particular example implementation, a conductive element may vary an impedance between the first and second terminals based, at least in part, on a signal provided to a third terminal of the conductive element (e.g., a based on a voltage or current applied to the third terminal). In one aspect, a conductive element may "close" to thereby connect first and second terminals in response to a signal provided on the third terminal. Likewise, a conductive element may "open" to thereby disconnect first and second terminals in response to a different signal provide on the third terminal. In one aspect, a conductive element in an open state may isolate a first portion of a circuit from a second portion of the circuit by removing or disrupting a conductive path between the first and second portions of the circuit. In another aspect, a conducting element may vary an impedance between first and second terminals between opened and closed state based on a signal provided to a third terminal.

Write operations performed in connection with FIGS. 7A and 7B are described herein as a particular process of placing a memory device such as a CES element in a particular low impedance state in a continuous range of low impedance states by applying a "programming signal" to terminals of the CES element. As discussed here, a particular impedance state in a continuous range of impedance states may correspond to a particular current Icomp in a continuous range of currents Icomp–min<Icomp<Icomp–max while a particular voltage level $V_{set}$ (e.g., in range 314) is to be applied.

Figure 8:
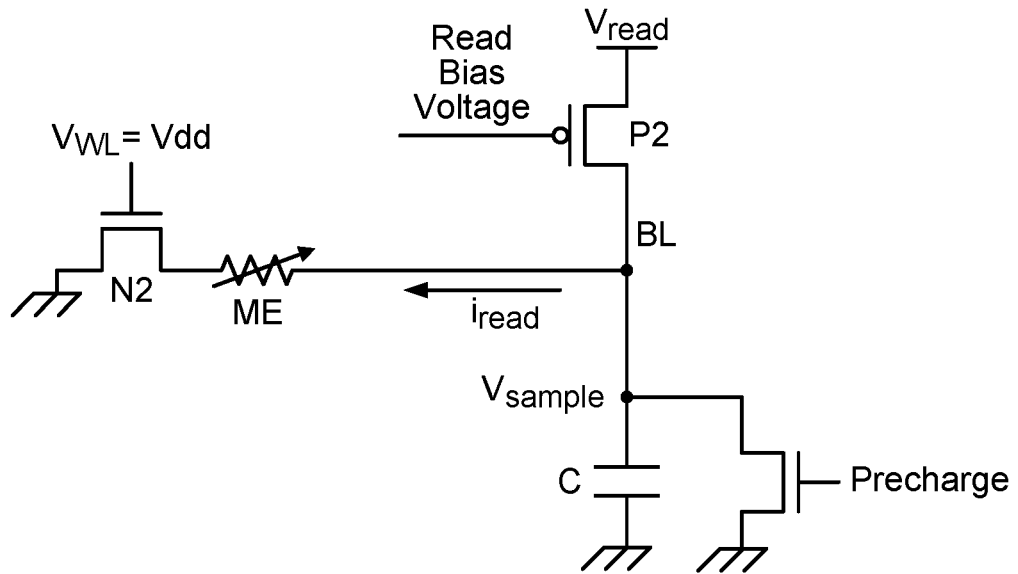
FIG. 8 is a schematic diagram of a circuit to detect a value, parameter, state or condition within a continuous range as represented by an impedance state of a memory element according to an embodiment.

FIG. 8 is a schematic diagram of a circuit to detect a value, parameter, state or condition within a continuous range as represented by an impedance state of a memory element according to an embodiment. In a particular example, the circuit of FIG. 8 may be used to read out or detect an analog signal stored in memory element ME according to FIG. 7A or 7B. Here, a voltage $V_{sample}$ on a terminal of capacitor C may represent the signal amplitude stored in memory element ME. In a read operation following a precharge operation to discharge bitline BL and capacitor C, a read bias voltage may be lowered to close PFET P2 and connect voltage $V_{read}$ to a first terminal of memory element ME while a voltage Vdd is applied to a gate terminal of access NFET N2 to apply $V_{read}$. In a particular implementation in which ME comprises CES element behaving as illustrated in FIG. 3, for example, application of $V_{read}$ (in a range 302) may provide a current $I_{read}$=Ird–LI in a range Ird–LImin<Ird–LI<Ird–LImax. Remaining current on bitline BL $I_{tot}-I_{read}$ may be integrated at capacitor C over a sample period to provide signal $V_{sample}$. Here, it may be observed that $V_{sample}$ may represent or map to a particular impedance state in a continuous range of low impedance states $V_{read}$/Ird–LImax<$V_{read}$ Ird–LI<$V_{read}$ Ird–LImin.

Figure 9:
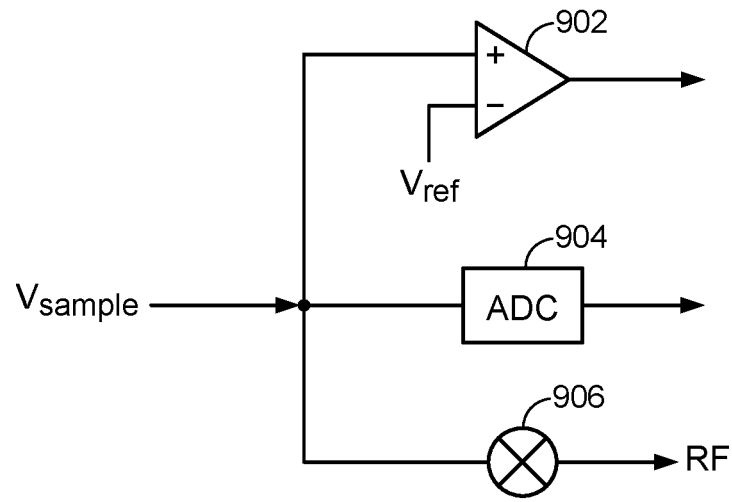
FIG. 9 is a schematic diagram of a circuit to process a detected value, parameter, state or condition within a continuous range as represented by an impedance state of a memory element according to an embodiment.

FIG. 9 is a schematic diagram of a circuit to process a detected value, parameter, state or condition within a continuous range as represented by a particular impedance state of a memory element within a continuous range of impedance states according to an embodiment. In a particular implementation, the circuit of FIG. 9 illustrates how an amplitude of a sampled analog signal recovered from a non-volatile memory element (e.g., as voltage $V_{sample}$ as shown in FIG. 8) may be applied according to particular alternatives. For example, signal $V_{sample}$ may be mixed with an oscillating signal to an upconverted RF signal at mixer 906. As pointed out above in connection with the particular implementation of FIG. 5, prior to being mixed with the oscillating signal, signal $V_{sample}$ may be amplified, low pass filtered and combined with baseband symbols prior to mixing with an oscillating signal at mixer 906. Alternatively, signal $V_{sample}$ may be converted to a digital signal by ADC 904. In another alternative, signal $V_{sample}$ may be applied to a terminal of a threshold detector 902 to send an alert or alarm if a value represented by $V_{sample}$ (e.g., temperature, atmospheric pressure, etc.) exceeds a threshold. It should be understood that these are merely examples of how signal $V_{sample}$ (e.g., representing a particular impedance state in a continuous range of impedance states) may be processed, and that claimed subject matter is not limited to any particular application.

Figure 10:
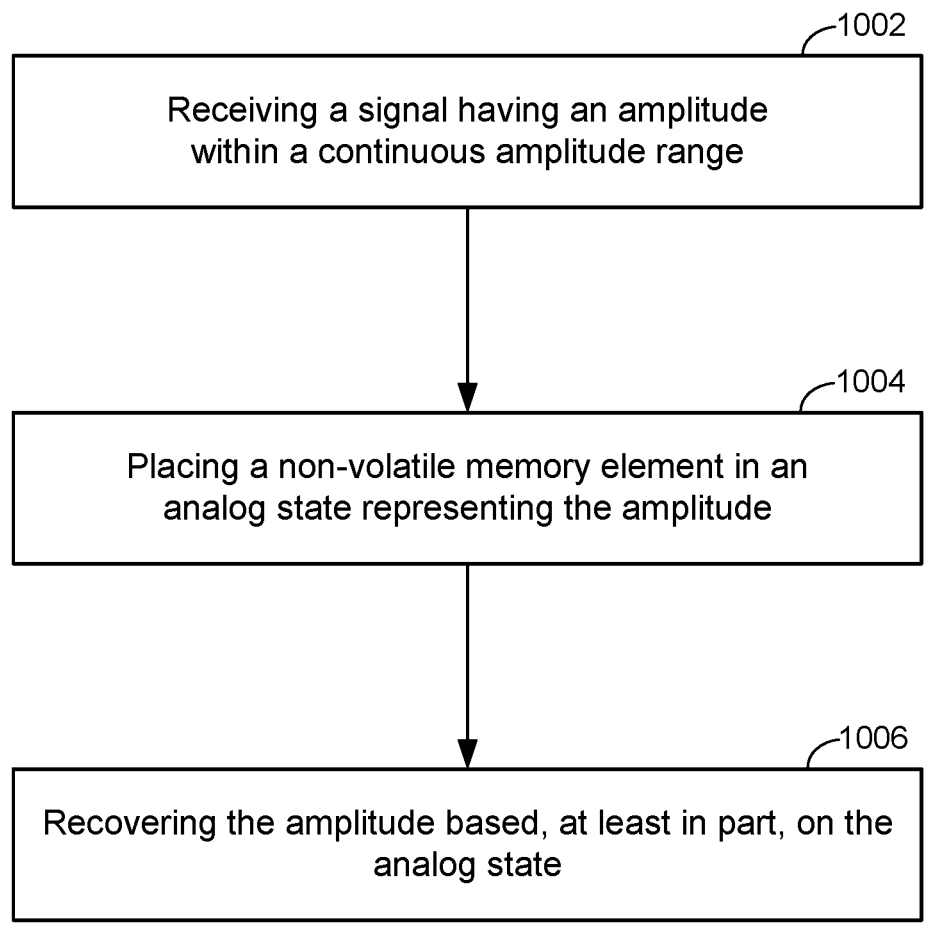
FIG. 10 is a flow diagram of a process according to an embodiment.

FIG. 10 is a flow diagram of a process of storing a value representing an amplitude of a signal over a continuous range, and recovering the amplitude according to an embodiment. Block 1002 comprises obtaining a signal having an amplitude within a continuous range. Such a signal may comprise, for example, a current signal generated by a sensor device (e.g., sensor 402), an analog signal downconverted from a received radio frequency signal or the like, just to provide a few examples. Additionally, a signal received at block 1002 may also have been processed and condition including, for amplified or attenuated for gain control and/or low pass filtered (e.g., at signal conditioner and amplifier 404).

Block 1004 comprises placing a non-volatile memory element in a particular analog state representing the amplitude within a continuous range. In this context, an "analog state" as referred to herein comprises a state of a device that may represent a particular value over a continuous range of values. For example, block 1004 may comprise placing a CES element in a particular impedance state representing the amplitude of the signal received at block 1002 over a continuous range of impedance states. In an embodiment, such a correlated electron element may comprise a CES element behaving in accordance with FIG. 3, enabling placement of the CES element in an analog state comprising a particular low impedance or conductive state over a continuous range of low impedance or conductive states. For example, block 1004 may apply a particular current Icomp to the CES element in a continuous range Icomp–min<Icomp<Icomp–max while a voltage in a range 314 is applied. In a particular implementation, block 1004 may place the correlated electron element in the particular impedance state using circuitry as shown in FIGS. 7A and 7B.

Block 1006 may recover the signal amplitude based on the analog state of the non-volatile memory element as determined at block 1004 to place non-volatile memory element in the particular analog state. For example, block 1006 may recover an amplitude represented by a correlated electron element (e.g., CES element behaving as illustrated in FIG. 3) by application of a voltage to the correlated electron element (e.g., application of a voltage in range 302) and measuring a resulting current. For example, as illustrated in FIG. 3, block 1106 may apply a voltage to a CES element in a range 302 and measuring a resulting current Ird–LI in a continuous range Ird–LImin<Ird–LI<Ird–LImax. The measured current may represent a particular low impedance $V_{read}$/Ird–LI state within a continuous range of low impedance states $V_{read}$/Ird–LImax<$V_{read}$/Ird–LI<$V_{read}$/Ird–LImin. In a particular implementation, the resulting current Ird–LI may be determined or measured based on a value of $V_{sample}$ as illustrated in the particular implementation of FIG. 8.

As pointed out above, a "non-volatile memory" comprises an integrated circuit device in which a memory cell or element maintains its memory state (e.g., a conductive or low impedance memory state, an analog state, or an insulative or high impedance memory state) after power supplied to the device is removed. In this context, a "wordline" comprises a conductor for transmitting a signal to select a particular bitcell or group of bitcells to be accessed in a read operation or a write operation. In a particular example implementation, a voltage of a signal on a wordline may be raised or lowered to select or deselect a particular bitcell or group of bitcells to be connected to a corresponding bitline or group of bitlines during a read or write operation. It should be understood, however, that this is merely an example of a wordline and that claimed subject matter is not limited in this respect. References throughout this specification to one implementation, an implementation, one embodiment, an embodiment and/or the like means that a particular feature, structure, and/or characteristic described in connection with a particular implementation and/or embodiment is included in at least one implementation and/or embodiment of claimed subject matter. Thus, appearances of such phrases, for example, in various places throughout this specification are not necessarily intended to refer to the same implementation or to any one particular implementation described. Furthermore, it is to be understood that particular features, structures, and/or characteristics described are capable of being combined in various ways in one or more implementations and, therefore, are within intended claim scope, for example. In general, of course, these and other issues vary with context. Therefore, particular context of description and/or usage provides helpful guidance regarding inferences to be drawn.

In particular embodiments, such as those previously described herein, plurality of CEM devices may be formed to bring about integrated circuit devices, which may include, for example, a correlated electron device having a CEM formed between terminals. Also, in an embodiment, a CEM device may be formed within a particular layer of an integrated circuit. Further, in an embodiment, forming a CEM device within a particular layer of an integrated circuit may include forming the CEM device at least in part by selective epitaxial deposition. In another embodiment, a CEM device within a particular layer of the integrated circuit may be formed at least in part by ion implantation, such as to alter impedance characteristics for the CEM device, for example.

Also, in an embodiment, two or more CEM devices may be formed within a particular layer of an integrated circuit at least in part by atomic layer deposition of a CEM.

In a further embodiment, one or more of a plurality of CEM devices may be individually positioned within an integrated circuit at one or more intersections of electrically conductive lines of a first metallization layer and electrically conductive lines of a second metallization layer, in an embodiment. One or more access devices may be positioned at a respective one or more of the intersections of the electrically conductive lines of the first metallization layer and the electrically conductive lines of the second metallization layer, wherein the access devices may be paired with respective CEM devices, in an embodiment.

According to an embodiment, a CEM device (e.g., a CES, which may be utilized to form a CEM switch, a CERAM memory device, and/or a variety of other electronic devices comprising one or more correlated electron materials, may be placed into a particular impedance state, such as by an injection of a sufficient quantity of electrons to satisfy a Mott transition criteria. In transitioning a CEM device to a particular low impedance state (e.g., over a continuum of low impedance states), if enough electrons are injected and the potential across the terminals of a CEM device overcomes a threshold switching potential (e.g., $V_{set}$), injected electrons may begin to screen. Screening may operate to unlocalize double-occupied electrons to collapse the band-splitting potential, thereby bringing about a relatively low-impedance state.

In one or more embodiments, changes in impedance states of CEM devices, such as from a relatively low-impedance state to a substantially dissimilar high-impedance state as discussed above, for example, may be brought about by the "back-donation" of electrons of compounds comprising $Ni_x$:$N_y$ (wherein the subscripts "x" and "y" comprise whole numbers). As the term is used herein, "back-donation" refers to a supplying of one or more electrons to a transition metal, transition metal oxide, or any combination thereof, by an adjacent molecule of the lattice structure, for example, comprising the transition metal, transition metal oxide, or combination thereof. Back-donation permits a transition metal, transition metal oxide, or combination thereof, to maintain an ionization state that is favorable to electrical conduction under the influence of an applied voltage. In one or more embodiments, back-donation in a correlated electron material, for example, may occur responsive to use of a dopant, such as carbonyl (CO), controllably and reversibly "donate" electrons to a conduction band of the transition metal or transition metal oxide, such as nickel, for example, during operation. Back-donation may be reversed, in a nickel oxide material, for example, (e.g., NiO:CO), which may thereby permit the nickel oxide material to switch to exhibiting a high-impedance property during device operation. Thus, in this context, a back-donating material refers to a material that exhibits an impedance switching property, such as switching from a first impedance state to a substantially dissimilar second impedance state (e.g., from a relatively low impedance state to a relatively high impedance state, or vice versa) based, at least in part, on influence of an applied voltage to control donation of electrons, and reversal of the electron donation, to and from a conduction band of the material.

In some embodiments, by way of back-donation, a CEM device comprising a transition metal or a transition metal oxide, may exhibit low-impedance properties if the transition metal, such as nickel, for example, is placed into an oxidation state of 2+ (e.g., $Ni^{2+}$ in a material, such as NiO:CO). Conversely, electron back-donation may be reversed if the transition metal, such as nickel, for example, is placed into an oxidation state of either 1+ or 3+. Accordingly, back-donation may result in "disproportionation," which may comprise substantially simultaneous oxidation and reduction reaction, such as:

$$2Ni^{2+} \rightarrow Ni^{1+} + Ni^{3+} \quad (6)$$

Such disproportionation, in this instance refers to formation of nickel ions as $Ni^{1+}+Ni^{3+}$ as shown in expression (6), which may bring about, for example, a relatively high-impedance state during operation of a CEM device. In an embodiment, a carbon-containing ligand, such as a carbonyl molecule (CO), may permit sharing of electrons during operation of the CEM device so as to permit the disproportionation reaction and its reversal:

$$Ni^{1+} + Ni^{3+} \rightarrow 2Ni^{2+} \quad (7)$$

As previously mentioned, reversal of the disproportionation reaction, as shown in expression (7), may permit nickel-based CEM to return to a relatively low-impedance state, in one or more embodiment.

In one or more embodiments, depending on an atomic concentration of carbon in NiO:CO, for example, which may vary from values approximately in the range of an atomic percentage of 0.1% to 10.0%, $V_{reset}$ and $V_{set}$, as shown in FIG. 1A, may vary approximately in the range of 0.1 V to 10.0 V subject to the condition that $V_{set} \geq V_{reset}$. For example, in one possible embodiment, $V_{reset}$ may occur at a voltage approximately in the range of 0.1 V to 1.0 V, and $V_{set}$ may occur at a voltage approximately in the range of 1.0 V to 2.0 V, for example. It should be noted, however, that variations in $V_{set}$ and $V_{reset}$ may occur based, at least in part, on a variety of factors, such as atomic concentration of a back-donating material, such as NiO:CO and other materials present in a CEM device, as well as other process variations, and claimed subject matter is not limited in this respect.

According to an embodiment, layers of CEM may be deposited in embodiments discussed above using any one of several deposition techniques such as, for example, atomic layer deposition to form films comprising nickel oxide materials, such as NiO:CO, to permit electron back-donation during operation of the device in a circuit environment, for example, to give rise to a low-impedance state. Also during operation in a circuit environment, for example, electron back-donation may be reversed so as to give rise to a high-impedance state, for example. In particular embodiments, atomic layer deposition may utilize two or more "precursor" sources to deposit components of, for example, NiO:CO, or other transition metal oxide, transition metal compounds or combinations thereof, onto a conductive substrate. In an embodiment, layers of a CEM device may be deposited utilizing separate molecules, AX and BY, according to expression (8), below:

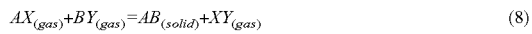
(8)

Wherein "A" of expression (8) corresponds to a transition metal, transition metal oxide, or any combination thereof. In embodiments, a transition metal oxide may comprise nickel, but may comprise other transition metals and/or transition metal oxides, such as aluminum, cadmium, chromium, cobalt, copper, gold, iron, manganese, mercury, molybdenum, nickel palladium, rhenium, ruthenium, silver, tin, titanium, vanadium.

In particular embodiments, CEM compounds that comprise more than one transition metal oxide may also be utilized, such as yttrium titanate (YTiO$_3$). "X" of expression (8) may comprise a ligand, such as organic ligand, comprising amidinate (AMD), dicyclopentadienyl (Cp)$_2$, diethylcyclopentadienyl (EtCp)$_2$, Bis(2,2,6,6-tetramethylheptane-3,5-dionato) ((thd)$_2$), acetylacetonate (acac), bis(methylcyclopentadienyl) (($CH_3C_5H_4)_2$), dimethylglyoximate (dmg)$_2$, 2-amino-pent-2-en-4-onato (apo)$_2$, (dmamb)$_2$ where dmamb=1-dimethylamino-2-methyl-2-butanolate, (dmamp)$_2$ where dmamp=1-dimethylamino-2-methyl-2-propanolate, Bis(pentamethylcyclopentadienyl) ($C_5(CH_3)_5$)$_2$ and carbonyl (CO)$_4$. Accordingly, in some embodiments, nickel-based precursors AX may comprise, for example, nickel amidinates (Ni(AMD)) an example of which is Ni(MeC(NBu)$_2$)$_2$, nickel dicyclopentadienyl (Ni(Cp)$_2$), nickel diethylcyclopentadienyl (Ni(EtCp)$_2$), Bis(2,2,6,6-tetramethylheptane-3,5-dionato)Ni(II) (Ni(thd)$_2$), nickel acetylacetonate (Ni(acac)$_2$), bis(methylcyclopentadienyl)nickel (Ni($CH_3C_5H_4$)$_2$, Nickel dimethylglyoximate (Ni(dmg)$_2$), Nickel 2-amino-pent-2-en-4-onato (Ni(apo)$_2$), Ni(dmamb)$_2$ where dmamb=1-dimethylamino-2-methyl-2-butanolate, Ni(dmamp)$_2$ where dmamp=1-dimethylamino-2-methyl-2-propanolate, Bis(pentamethylcyclopentadienyl) nickel (Ni($C_5(CH_3)_5$)$_2$, and nickel carbonyl (Ni(CO)$_4$), just to name a few examples.

In expression (8), "BY" may comprise an oxidizer, such as oxygen ($O_2$), ozone ($O_3$), nitric oxide (NO), nitrous oxide ($N_2O$), hydrogen peroxide ($H_2O_2$), water ($H_2O$), just to name a few examples. In embodiments, the AX compound may comprise a transition metal oxide or a transition metal compound. BY may comprise a species chosen such that the reaction shown of expression (9) may form AB, wherein AB represents the CEM formed by the process. In other embodiments, plasma may be used with an oxidizer to form oxygen radicals or other activated species to form one or more layers of CEM. In other embodiments, one or more CEM layers may be deposited using chemical vapor deposition of any type or by sputter deposition or by physical vapor deposition. Therefore, in some embodiments, the X and/or Y may not be required to form AB (such as in the case of sputtering from a target of AB or co sputtering from a target of A and a target of B, or sputtering from a target of A in an ambient environment comprising B. It should be noted that concentrations, such as atomic concentration, of precursor, such as AX and BY may be adjusted so as to bring about a final atomic concentration of carbon, such as in the form of carbonyl, of between approximately 0.1% and 10.0%. However, claimed subject matter is not necessarily limited to the above-identified precursors and/or concentrations. Rather, claimed subject matter is intended to embrace all such precursors utilized in atomic layer deposition, chemical vapor deposition, plasma chemical vapor deposition, sputter deposition, physical vapor deposition, hot wire chemical vapor deposition, laser enhanced chemical vapor deposition, laser enhanced atomic layer deposition, rapid thermal chemical vapor deposition or the like, utilized in fabrication of CEM devices.

In particular embodiments, such as embodiments utilizing atomic layer deposition, a substrate may be exposed to precursors in a heated chamber, which may attain, for example, a temperature approximately in the range of 20.0° C. to 1000.0° C., for example, or between temperatures approximately in the range of 20.0° C. and 500.0° C. in certain embodiments. In one particular embodiment, in which atomic layer deposition of NiO:CO is performed, temperature ranges approximately in the range of 20.0° C. and 400.0° C. may be utilized. After exposure to precursor sources, such sources may be purged from the heated chamber, wherein purging may occur over durations approximately in the range of 0.5 seconds to 180.0 seconds. It should be noted, however, that these are merely examples of potentially suitable temperatures and exposure times, and claimed subject matter is not limited in this respect.

In certain embodiments, a single two-precursor cycle utilizing atomic layer deposition may bring about a CEM device layer comprising a thickness approximately in the range of 0.6 Å to 1.5 Å. Accordingly, in an embodiment, to form a CEM device film comprising a thickness of approximately 500 Å utilizing an atomic layer deposition process in which layers comprise a thickness of approximately 0.6 Å, 800-900 two-precursor cycles, such as AX+BY of equation (9), for example, may be utilized. In another embodiment, utilizing an atomic layer deposition process in which layers comprise approximately 1.5 Å, 300 to 350 two-precursor cycles, such as AX+BY, for example, may be utilized. It should be noted that atomic layer deposition may be utilized to form CEM device films having other thicknesses, such as thicknesses approximately in the range of 1.5 nm and 150.0 nm, for example, and claimed subject matter is not limited in this respect.

While there has been illustrated and described what are presently considered to be example features, it will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular examples disclosed, but that such claimed subject matter may also include all aspects falling within the scope of the appended claims, and equivalents thereof.

What is claimed is:

1. A method comprising:
   receiving a signal having an amplitude within a continuous amplitude range, the amplitude to represent a particular analog value, symbol, parameter, condition and/or state within a continuous range of analog values, symbols, conditions and/or states, the particular analog value, symbol, parameter, condition and/or state to map to a real number of real numbers within the continuous range of values, symbols, conditions and/or states;
   placing a material of a non-volatile memory element, the material being configured to be placed in a high impedance and/or insulative state and a continuous range of low impedance and/or conductive states, in a particular low impedance and/or conductive state within the continuous range of low impedance and/or conductive states representing the amplitude by modulating a magnitude of a current in the non-volatile memory element based, at least in part, on the amplitude;
   recovering the amplitude based, at least in part, on the particular low impedance and/or conductive state, the recovered amplitude to represent the real number of real numbers within the continuous range of values, symbols, conditions and/or states; and
   applying the recovered amplitude as an analog signal input to a circuit to affect operation of the circuit based, at least in part, on the real number represented by the recovered amplitude.

2. The method of claim 1, wherein the non-volatile memory element to be placed in the particular low impedance and/or conductive state at a first rate and the amplitude to be recovered based, at least in part, on the particular low impedance and/or conductive state at a second rate slower than the first rate.

3. The method of claim 2, wherein placing the non-volatile memory element in the particular low impedance and/or conductive state comprises applying a programming signal, the programming signal to comprise the current, to place the non-volatile memory element in the particular low impedance and/or conductive state, and further comprising quantizing the recovered amplitude and subsequently placing multiple binary memory elements in states to represent the recovered amplitude as an equivalent multi-bit digital representation.

4. The method of claim 1, wherein the non-volatile memory element to comprise a correlated electron element, and wherein placing the non-volatile memory element in the particular low impedance and/or conductive state comprises placing the correlated electron element in an impedance state representing the amplitude, and wherein recovering the amplitude comprises recovering the amplitude based, at least in part, on the impedance state of the correlated electron element.

5. The method of claim 1, wherein recovering the amplitude further comprises mapping the particular low impedance and/or conductive state to an output signal value defined over the continuous range of values, symbols, conditions and/or states.

6. The method of claim 1, and further comprising sampling the recovered amplitude to provide a digital representation of the recovered amplitude following a change in a power state of a computing device or a change in an environmental condition of the computing device, or a combination thereof.

7. The method of claim 6, wherein the change in the environmental condition to comprise a change in an ambient temperature, ambient acoustical vibration, ambient radio frequency signals, ambient light or atmospheric pressure, or a combination thereof.

8. The method of claim 1, and further comprising mixing the recovered amplitude with an oscillator to provide a radio frequency signal.

9. The method of claim 4, wherein recovering the amplitude further comprises:
   measuring a current through the correlated electron element while applying a read voltage across terminals of the correlated electron element; and
   mapping the measured current to an output signal real value defined over a continuous analog range.

10. The method of claim 1, wherein the magnitude of the current in the non-volatile memory element to place the material in the particular low impedance and/or conductive states to impart a first current density in the material, and wherein the material is capable of being transitioned from the particular low impedance and/or conductive state to the high impedance and/or insulative state responsive, at least in part, to application of a second current density in the material equaling or exceeding the first current density.

11. A device comprising:
    a storage circuit to obtain a signal to have an amplitude with a continuous amplitude range, the amplitude to represent a particular analog value, symbol, parameter, condition and/or state within a continuous range of analog values, symbols, conditions and/or states, the particular analog value, symbol, parameter, condition and/or state to map to a real number of real numbers within the continuous range of values, symbols, conditions and/or states;
    a write circuit to place a non-volatile memory element in an analog state to represent the amplitude, the non-volatile memory element to comprise a material of being configured to be placed in a high impedance and/or insulative state and a particular low impedance and/or conductive state within a continuous range of low impedance and/or conductive states to represent the amplitude, the write circuit to modulate a magnitude of a current in the non-volatile memory element based, at least in part, on the amplitude to place the material in the particular low impedance and/or conductive state within the continuous range of low impedance and/or conductive states; and
    a read circuit to recover the amplitude based on the particular low impedance and/or conductive state, the recovered amplitude to represent the real number of real numbers within the continuous range of values, symbols, conditions and/or states, and apply the recovered amplitude as an analog signal input to a circuit to affect operation of the circuit based, at least in part, on the real number of the recovered amplitude.

12. The device of claim 11, wherein the write circuit to place the non-volatile memory element in the particular low impedance and/or conductive state at a first rate and the read circuit to obtain the recovered amplitude at a second rate slower than the first rate.

13. The device of claim 11, wherein the recovered amplitude to be mapped to an output signal value defined over the continuous range of values, symbols, conditions and/or states.

14. The device of claim 11, wherein the non-volatile memory element to comprise a correlated electron switch (CES) element, and wherein the particular low impedance and/or conductive state to comprise an impedance state of the CES element.

15. The device of claim 11, and further comprising a circuit to sample the recovered amplitude to obtain a digital representation of the recovered amplitude to follow a change in a power state of a computing device or a change in an environmental condition, or a combination thereof.

16. The device of claim 15, wherein the change in the environmental condition to comprise a change in an ambient temperature, ambient acoustical vibration, ambient radio frequency signals, ambient light or atmospheric pressure, or a combination thereof.

17. The device of claim 11, and further comprising a mixer to mix the recovered amplitude with an oscillator to provide a radio frequency signal.

18. The device of claim 14, wherein the write circuit further comprises:
    a voltage source to maintain a voltage across terminals of the CES element while a current density is to be applied in the CES element to have a magnitude based, at least in part, on the amplitude of the obtained signal.

19. The device of claim 11, wherein the read circuit to obtain the recovered amplitude based, at least in part, on a measurement of current through the non-volatile memory element while a read voltage is applied across terminals of the non-volatile memory element.

20. The device of claim 19, wherein the measurement of current to be mapped to a value, parameter, symbol, condition and/or state over [a] the continuous range of values, parameters, symbols, conditions and/or states.

21. The device of claim 14, wherein the read circuit further to comprise:
    a voltage source to apply a read voltage to terminals of the non-volatile memory element; and
    a capacitor to be charged responsive to a current signal generated responsive to application of the read voltage to the terminals of the non-volatile memory element over a duration, wherein a voltage of the charged capacitor to be representative of the recovered amplitude.

22. The device of claim 11, wherein the magnitude of the current in the non-volatile memory element to place the material in the particular low impedance and/or conductive states to impart a first current density in the material, and wherein the material is capable of being transitioned from the particular low impedance and/or conductive state to the high impedance and/or insulative state responsive, at least in part, to application of a second current density in the material equaling or exceeding the first current density.

23. The method of claim 1, wherein the material of the non-volatile memory element is capable of being switched between the high impedance and/or insulative state and the particular low impedance and/or conductive state responsive to a Mott transition.

\* \* \* \* \*